United States Patent
Inoue

(10) Patent No.: US 7,479,829 B2
(45) Date of Patent: Jan. 20, 2009

(54) CLASS D AMPLIFIER AND INFRARED DATA RECEIVING APPARATUS USING THE SAME

(75) Inventor: Takahiro Inoue, Katsuragi (JP)

(73) Assignee: Sharp Kabushiki Kaisha, Osaka (JP)

( * ) Notice: Subject to any disclaimer, the term of this patent is extended or adjusted under 35 U.S.C. 154(b) by 93 days.

(21) Appl. No.: 11/589,136

(22) Filed: Oct. 30, 2006

(65) Prior Publication Data

US 2007/0109048 A1    May 17, 2007

(30) Foreign Application Priority Data

Oct. 31, 2005    (JP) .............................. 2005-317554

(51) Int. Cl.
    *H03F 3/217*    (2006.01)
(52) U.S. Cl. .................... 330/251; 330/207 A
(58) Field of Classification Search ............ 330/251, 330/10, 207 A; 375/238
    See application file for complete search history.

(56) References Cited

U.S. PATENT DOCUMENTS 4,115,740 A * 9/1978 Yoshida et al. .............. 330/264

2004/0062362 A1    4/2004  Matsuya

FOREIGN PATENT DOCUMENTS

| JP | 57-170608 A | 10/1982 |
|----|-------------|---------|
| JP | 2003-338715 A | 11/2003 |
| JP | 2004-135321 A | 4/2004 |

* cited by examiner

*Primary Examiner*—Robert Pascal
*Assistant Examiner*—Hieu P Nguyen
(74) *Attorney, Agent, or Firm*—Birch, Stewart, Kolasch & Birch, LLP

(57) ABSTRACT

A class D amplifier includes: an amplifier circuit in which a high side switching element and a low side switching element are connected in series between power sources; a high side gate driving circuit for driving a high side gate of the high side switching element; and a low side gate driving circuit for driving a low side gate of the low side switching element. In the class D amplifier, the high side gate driving circuit is configured so that a charging time of the high side gate is shorter than a discharging time of the high side gate, and the low side gate driving circuit is configured so that a charging time of the low side gate is longer than a discharging time of the low side gate.

14 Claims, 24 Drawing Sheets

$Cgg = Cgb + Cgd + Cgs$ $Cgg = Cgb + Cgd + Cgs$

CONVENTIONAL ART

CONVENTIONAL ART

HIGH SIDE ON/LOW SIDE ON
(SIMULTANEOUSLY ON)

HIGH SIDE OFF/LOW SIDE OFF
(SIMULTANEOUSLY OFF)

HIGH SIDE ON/LOW SIDE OFF

HIGH SIDE OFF/LOW SIDE ON

CONVENTIONAL ART

CONVENTIONAL ART

CONVENTIONAL ART

CLASS D AMPLIFIER AND INFRARED DATA RECEIVING APPARATUS USING THE SAME

This non-provisional application claims priority under 35 U.S.C. § 119(a) on Patent Application No. 317554/2005 filed in Japan on Oct. 31, 2005, the entire contents of which are hereby incorporated by reference.

FIELD OF THE INVENTION

The present invention relates to (i) a class D amplifier in which MOS transistors both at a high side and a low side are driven in response to a PWM (Pulse Width Modulation) signal or a PDM (Pulse Density Modulation) signal and (ii) an infrared data receiving apparatus which includes the class D amplifier and wirelessly receives infrared audio data.

BACKGROUND OF THE INVENTION

Recently, devices for processing digital audio signals have been actively developed. This accompanies development of digital audio signal techniques used for connection between devices. A well-known example of such techniques is a data communication system (Document 1) in which: when audio data is transmitted by use of an infrared communication device (IrDA: Infrared Data Association), a 1-bit data sequence having been subjected to a PDM (Pulse Density Modulation) is transmitted.

FIG. 19 illustrates a structure of a data receiving apparatus which uses such infrared communication device.

As illustrated in FIG. 19, the data receiving apparatus includes a receiving section 1001, a speaker driving section 1002, and a speaker 1003. The data receiving apparatus causes the receiving section 1001 to receive a 1-bit data sequence having been subjected to a PDM and causes the speaker driving section 1002 to drive the speaker 1003. Examples of conventional means for receiving infrared ray, which is used in the receiving section 1001, include an IrDA receiving device and an infrared remote control receiving device. In consideration of a communication rate, an IrDA receiving device having 1.152 Mbps (MIR) or 4 Mbps (FIR) is appropriate for the infrared receiving means.

TABLE 1

Specs of IrDA receiving device

| Communication rate | Pulse width | T |
|---|---|---|
| 4 Mbps (FIR) | (¼)*T | 500µ sec |
| 1.152 Mbps (MIR) | (¼)*T | 868µ sec |
| 2.4 Kbps~115.2 Kbps(SIR) | (3/16)*T | 8.68µ sec~104µ sec |

TABLE 2

Specs of infrared remote control receiving device

| Communication rate | Pulse width | T |
|---|---|---|
| 1 Kbps or less | Different with respect to each transmission code | Different with respect to each transmission code |

Further, the data receiving apparatus receives audio data having been converted into coarse-to-fine data of a pulse sequence by use of a PDM. Therefore, by including the receiving section 1001, the speaker driving section 1002, and the speaker 1003 which serves as an LPF, the data receiving apparatus can easily convert audio data into audio. In this way, the data receiving apparatus can be applicable to a wireless phone or other apparatuses by causing the infrared communication device to communicate audio data which is a 1-bit data sequence having been subjected to the PDM.

In reproducing audio from such 1-bit digital signal (PDM signal) or PWM signal, these modulation signals have small amplitudes and therefore a load (speaker) cannot be directly driven in response to the modulation signals. Therefore, in order to amplify the amplitudes of the modulation signals so that the load can be driven in response to the modulation signals, a class D amplifier is used in the speaker driving section 1002.

FIG. 20 illustrates a circuit structure of a switching amplifier stage in a conventional class D amplifier. FIG. 21 illustrates an operational waveform of the switching amplifier stage.

The class D amplifier which drives a speaker by use of a PDM signal or PWM signal includes the switching amplifier stage illustrated in FIG. 20. The switching amplifier stage includes: a high side switching element HSW provided at the side of a high potential power source; a low side switching element LSW provided at the side of a low potential power source (alternatively, ground); and transistors Q101 to Q104.

The high side switching element HSW and the low side switching element LSW are made of a power MOSFET (Metal-Oxide Semiconductor Field-Effect Transistor) for example. Further, a high side gate driving circuit includes an inverter made of the transistor Q101 which is a pMOS transistor and the transistor Q102 which is an nMOS transistor. On the other hand, a low side gate driving circuit includes an inverter made of the transistor Q103 which is a pMOS transistor and the transistor Q104 which is an nMOS transistor.

As illustrated in FIG. 21, in the switching amplifier stage, when an input signal IN is Hi ("1"), a logic level of a high side gate GH (a gate of the high side switching element HSW) and a logic level of a low side gate GL (a gate of a low side switching element LSW) are Lo and an output signal out(p) is Hi. Further, in the switching amplifier stage, when the input signal IN is Lo ("0"), the logic level of the high side gate GH and the logic level of the low side gate GL are Hi and the output signal out(p) is Lo.

In the switching amplifier stage, when the high side switching element HSW and the low side switching element LSW are ON simultaneously, a shoot-through current flows between the high potential power source and the low potential power source via the switching elements HSW and LSW.

FIGS. 22(a) to 22(d) illustrate operations of two switching elements which constitute the last stage of a class D amplifier.

Here, the high side switching element HSW is a p channel MOSFET and the low side switching element LSW is an n channel MOSFET. When the logic level of the high side gate GH is "0", the high side switching element HSW is ON. When the logic level of the high side gate GH is "1", the high side switching element HSW is OFF. On the other hand, when the logic level of the low side gate GL is "1", the low side switching element LSW is ON. When the logic level of the low side gate GL is "0", the low side switching element LSW is OFF.

In a general operational condition, the high side switching element HSW and the low side switching element LSW operate in the manner illustrated in FIG. 22(c) or 22(d). In the operational condition illustrated in FIG. 22(c) (when an input signal IN is Hi), the switching element HSW is ON and the low side switching element LSW is OFF. Consequently, a driving current Id flows toward a load LD via the high side switching element HSW, which causes an output signal out (p) to be Hi. On the other hand, in the operational condition illustrated in FIG. 22(d) (when the input signal IN is Lo), the high side switching element HSW is OFF and the low side switching element LSW is ON. Consequently, the driving current Id flows from the load LD via the low side switching element LSW, which causes the output signal out(p) to be Lo.

As illustrated in FIG. 22(a), in a condition under which the high side switching element HSW and the low side switching element LSW which are connected with each other in series are ON, a shoot-through current Is flows via the high side switching element HSW and the low side switching element LSW. Contrary to the condition, as illustrated in FIG. 22(b), in a condition under which the high side switching element HSW and the low side switching element LSW are OFF, the shoot-through current Is does not flow.

Digital audio data is generally represented in a PCM (Pulse Code Modulation) format. In order to amplify the digital audio data by use of a class D amplifier, it is necessary to convert a PCM signal supplied from a medium such as a CD, an MD, and a DVD into a PDM signal for example (to perform a PDM conversion), by use of a special IC.

A data receiving apparatus which receives audio data as described above performs wireless communication and therefore is driven by use of a battery. A class D amplifier provided in the data receiving apparatus which is driven by use of a battery has such a problem that power consumption caused by the shoot-through current quickens consumption of a battery.

In order to solve the problem, there is adopted a driving method which makes an operational condition illustrated in FIG. 22(b), in which no shoot-through current flows. The operational condition in which the high side switching element HSW and the low side switching element LSW are OFF is generally referred to as a dead time. In a class D amplifier, in order to reduce a shoot-through current, there is generally provided a circuit for generating a dead time (see Document 2 for example).

FIG. 23 illustrates an example of a structure of a dead time generating circuit in a class D amplifier. FIG. 24 illustrates operations of the dead time generating circuit and a switching amplifier stage in the class D amplifier.

The dead time generating circuit illustrated in FIG. 23 includes an inverter 101, a delay circuit 102, an NOR circuit 103, and an NAND circuit 104.

In the dead time generating circuit, an input signal IN having been inverted by the inverter 101 is inputted to the NOR circuit 103 and the NAND circuit 104 as it is, whereas the input signal IN is delayed by the delay circuit 102 for a predetermined time and then is inputted to the NOR circuit 103 and the NAND circuit 104. Consequently, as illustrated in FIG. 24, the NOR circuit 103 outputs a logical NOR between an output of the inverter 101 (inverter output) and an output of the delay circuit 102 (delay output). Further, the NAND circuit 104 outputs a logical NAND between the inverter output and the delay output. Consequently, the logic level of the high side gate GH is Hi while the NOR output is Lo, so that the high side switching element HSW is OFF. On the other hand, the logic level of the low side gate GL is Hi while the NAND output is Lo, so that the low side switching element LSW is ON.

Here, the NOR output falls from Hi to Lo and after a delay time td0 given by the delay circuit 102, the NAND output falls from Hi to Lo. The NAND output rises from Lo to Hi and after the delay time td0, the NOR output rises from Lo to Hi. Consequently, during the delay time td0 from a time when the logic level of the high side gate GH changes to Hi to a time when the logic level of the low side gate GL changes to Hi, the high side switching element HSW and the low side switching element LSW are OFF. In the same way, during the delay time td0 from a time when the logic level of the low side gate GL changes to Lo to a time when the logic level of the high side gate GH changes to Lo, the high side switching element HSW and the low side switching element LSW are OFF. In this way, dead times dt1 and dt2 are obtained based on the delay time td0.

In the dead time generating circuit, a dead time is determined by use of a predetermined delay time given by the delay circuit, so that it is difficult to change the delay time. In order to avoid such inconvenience, Document 3 discloses an arrangement which allows prompt and easy adjustment of a dead time. This arrangement includes a dead time adjusting circuit for monitoring gate signals of a high side switching element HSW and a low side switching element LSW, generating, from the gate signal, a DC voltage signal which is proportional to a dead time, and adjusting the dead time on the basis of the DC voltage signal.

Document 1: Japanese Unexamined Patent Publication No. 135321/2004 (Tokukai 2004-135321; published on Apr. 30, 2004)

Document 2: Japanese Unexamined Patent Publication No. 170608/1982 (Tokukaisho 57-170608; published on Oct. 20, 1982)

Document 3: Japanese Unexamined Patent Publication No. 338715/2003 (Tokukai 2003-338715; published on Nov. 28, 2003)

A dead time may comparably vary with respect to each product. Therefore, the dead time adjusting circuit is adopted so that a dead time can be easily adjusted after a class D amplifier is produced (at a time of shipping the class D amplifier). However, the dead time adjusting circuit is not used after the class D amplifier is shipped as a product. Consequently, the dead time adjusting circuit merely complexes the structure of the class D amplifier, which prevents the class D amplifier to be produced in low costs.

On the other hand, if a dead time can be appropriately set in accordance with specs of a class D amplifier in designing the class D amplifier, then it is possible to almost omit the adjustment of a dead time.

SUMMARY OF THE INVENTION

An object of the present invention is to provide a class D amplifier which allows setting of a desired dead time with a simple structure.

In order to achieve the foregoing object, the class D amplifier of the present invention includes: an amplifier circuit in which a high side switching element and a low side switching element are connected in series between power sources; a high side gate driving circuit for driving a high side gate of the high side switching element; and a low side gate driving circuit for driving a low side gate of the low side switching element, wherein the high side gate driving circuit and the low side gate driving circuit are configured so that a charging time of the high side gate is set to be shorter than a discharging time of the high side gate, and a charging time of the low side gate is set to be longer than a discharging time of the low side gate.

With the arrangement, the charging time of the high side gate is set to be shorter than the discharging time of the high side gate and the charging time of the low side gate is set to be longer than the discharging time of the low side gate. Consequently, a potential of the high side gate changes more rapidly when the potential rises than when the potential falls, whereas a potential of the low side gate changes more slowly when the potential rises than when the potential falls (see how the potentials of the high side gate GH1 and the low side gate GL1 change in FIG. 6 for example).

Therefore, there is a difference between the change of the potential of the high side gate and the change of the potential of the low side gate. Consequently, there is a difference in time between (i) a period from a time when the high side switching element is OFF to a time when the low side switching element is ON and (ii) a period from a time when the low side switching element is OFF to a time when the high side switching element is ON. During a period caused by the difference in time, both of the switching elements are OFF. Therefore, the difference in time makes a dead time.

In this way, with the arrangement, a dead time can be made by setting charging/discharging times of the high side gate and the low side gate.

For a fuller understanding of the nature and advantages of the invention, reference should be made to the ensuing detailed description taken in conjunction with the accompanying drawings.

DESCRIPTION OF THE EMBODIMENTS

With reference to FIGS. 1 to 18, the following explains an embodiment of the present invention.

Figure 1:
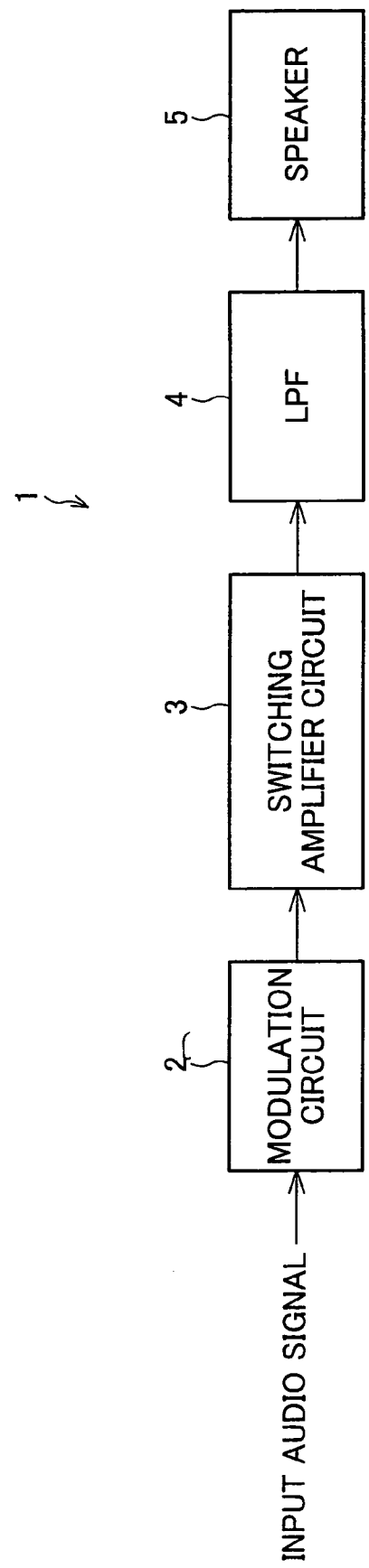
FIG. 1 is a block diagram illustrating a structure of a class D amplifier in an embodiment of the present invention.

FIG. 1 schematically illustrates a structure of a class D amplifier 1 in an embodiment of the present invention.

As illustrated in FIG. 1, the class D amplifier 1 includes a modulation circuit 2, a switching amplifier circuit 3, and a low pass filter (LPF in FIG. 1) 4.

As illustrated in FIG. 1, the modulation circuit 2 converts an input audio signal (an analog signal or a PCM signal) into a PDM signal or a PWM signal and outputs the PDM signal or the PWM signal. The switching amplifier circuit 3 includes a power switching circuit which allows/does not allow a load current to flow therein on the basis of a modulation signal outputted by the modulation circuit 2, thereby amplifying the modulation signal. The low pass filter 4 averages the level of the modulation signal amplified by the switching amplifier circuit 3 and removes unnecessary high noises included in the amplified modulation signal, thereby reproducing an amplified input audio signal.

In the present embodiment, the following embodiments explain various arrangements of the switching amplifier circuit 3.

[Embodiment 1]

Figure 2:
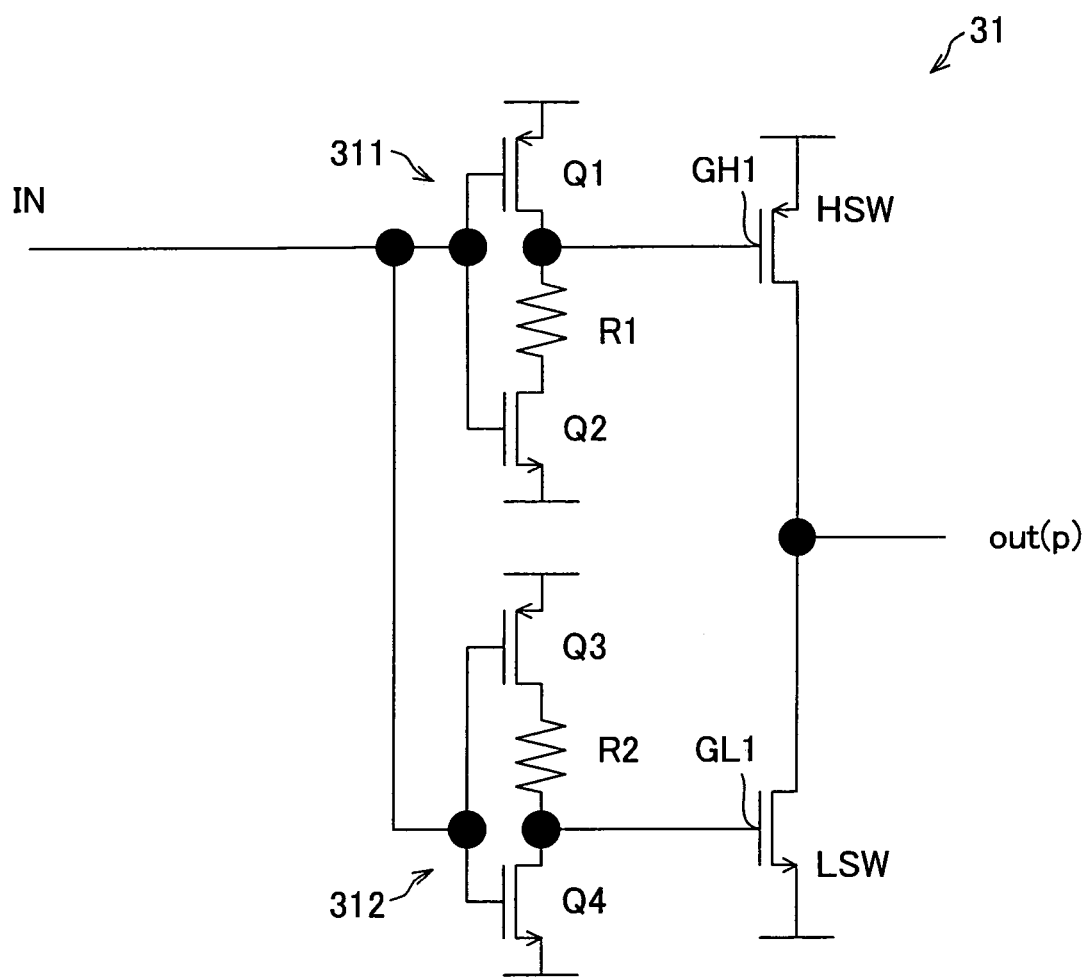
FIG. 2 is a circuit diagram illustrating a structure of a switching amplifier circuit in Embodiment 1 of the class D amplifier.

FIG. 2 illustrates a main structure of a switching amplifier circuit 31 of the present embodiment.

As illustrated in FIG. 2, the switching amplifier circuit 31 includes a high side switching element HSW, a low side switching element LSW, a high side gate driving circuit 311, and a low side gate driving circuit 312.

The high side switching element HSW and the low side switching element LSW are connected in series between a high potential power source (Vdd) and a low potential power source (GND). Further, an output voltage out(p) is outputted from between the high side switching element HSW and the low side switching element LSW. The high side switching element HSW is a p channel MOSFET and the low side switching element LSW is an n channel MOSFET.

The high side gate driving circuit 311 is an inverter circuit which includes a pMOS transistor Q1, an nMOS transistor Q2, and a resistor R1. The low side gate driving circuit 312 is an inverter circuit which includes a pMOS transistor Q3, an nMOS transistor Q4, and a resistor R2. An input signal IN is inputted to respective gates of the pMOS transistor Q1, the nMOS transistor Q2, the pMOS transistor Q3, and the nMOS transistor Q4.

The pMOS transistor Q1 is connected between a high potential power source and a gate of the high side switching element HSW (high side gate GH1). One end of the resistor R1 is connected with the high side gate GH1 and the other end of the resistor R1 is connected with a drain of the nMOS transistor Q2. A source of the nMOS transistor Q2 is connected with a low potential power source. The high side gate driving circuit 311 constitutes the inverter circuit in this manner.

A source of the pMOS transistor Q3 is connected with a high potential power source and a drain of the pMOS transistor Q3 is connected with one end of the resistor R2. The other end of the resistor R2 is connected with a gate of the low side switching element LSW (low side gate GL1). The nMOS transistor Q4 is connected between the low side gate GL1 and a low potential power source. The low side gate driving circuit 312 constitutes the inverter circuit in this manner.

The resistors R1 and R2 have an identical resistance value R01.

Figure 3:
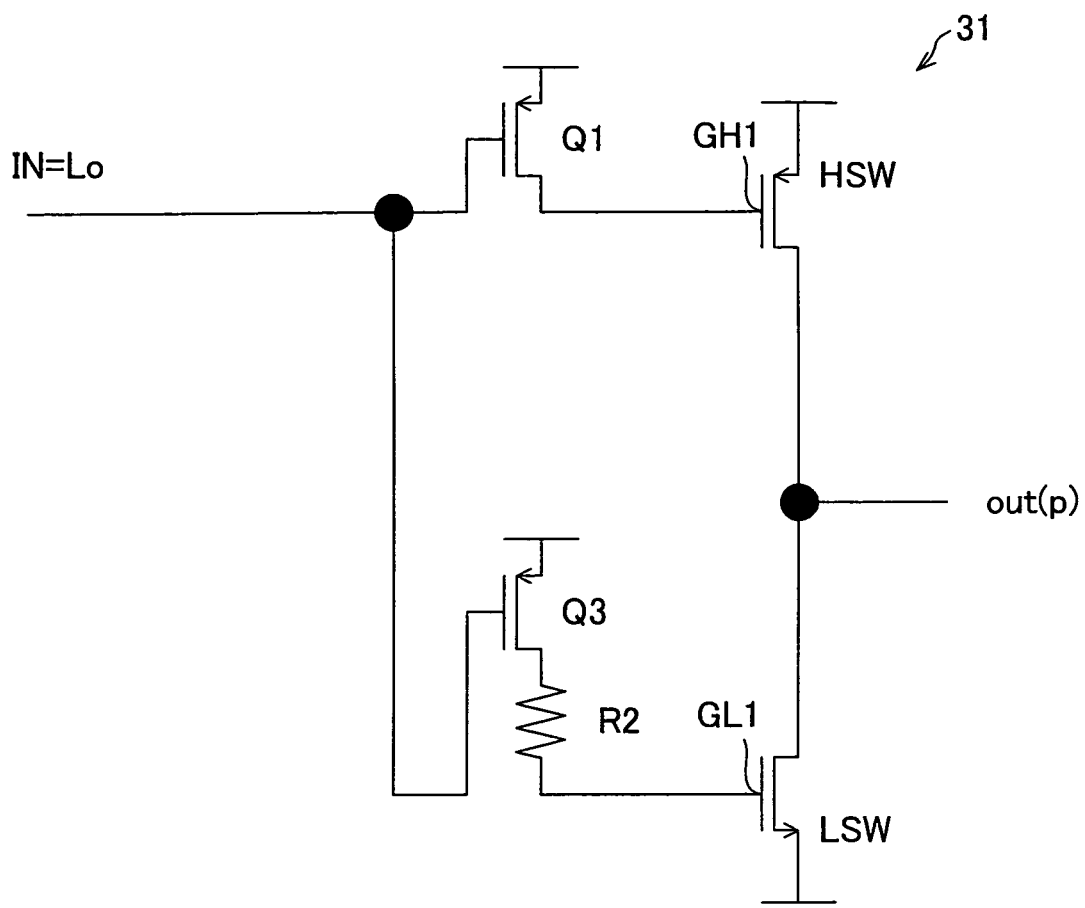
FIG. 3 is a circuit diagram illustrating an equivalent circuit for the switching amplifier circuit in FIG. 2 while the switching amplifier circuit is charged.

FIG. 3 illustrates an equivalent circuit for the switching amplifier circuit 31 in FIG. 2 while the switching amplifier circuit 31 is charged.

While charging the switching amplifier circuit 31, an input signal IN is Lo ("0"). Consequently, the pMOS transistor Q1 is ON, whereas the nMOS transistor Q2 is OFF, so that the resistor R1 is not connected with the high side gate GH1 (it is the same as a case where the resistor R1 does not exist). Further, the pMOS transistor Q3 is ON, whereas the nMOS transistor Q4 is OFF, so that the resistor R2 is connected with the low side gate GL1. The equivalent circuit illustrated in FIG. 3 is formed in this manner.

In the equivalent circuit, the high side gate GH1 is charged with a time constant Ron*Cgg, and the low side gate GL1 is charged with a time constant (Ron+R01)*Cgg. Here, Ron is an ON resistance of an MOS transistor and Cgg is a gate capacity of the MOS transistor.

Figure 4:
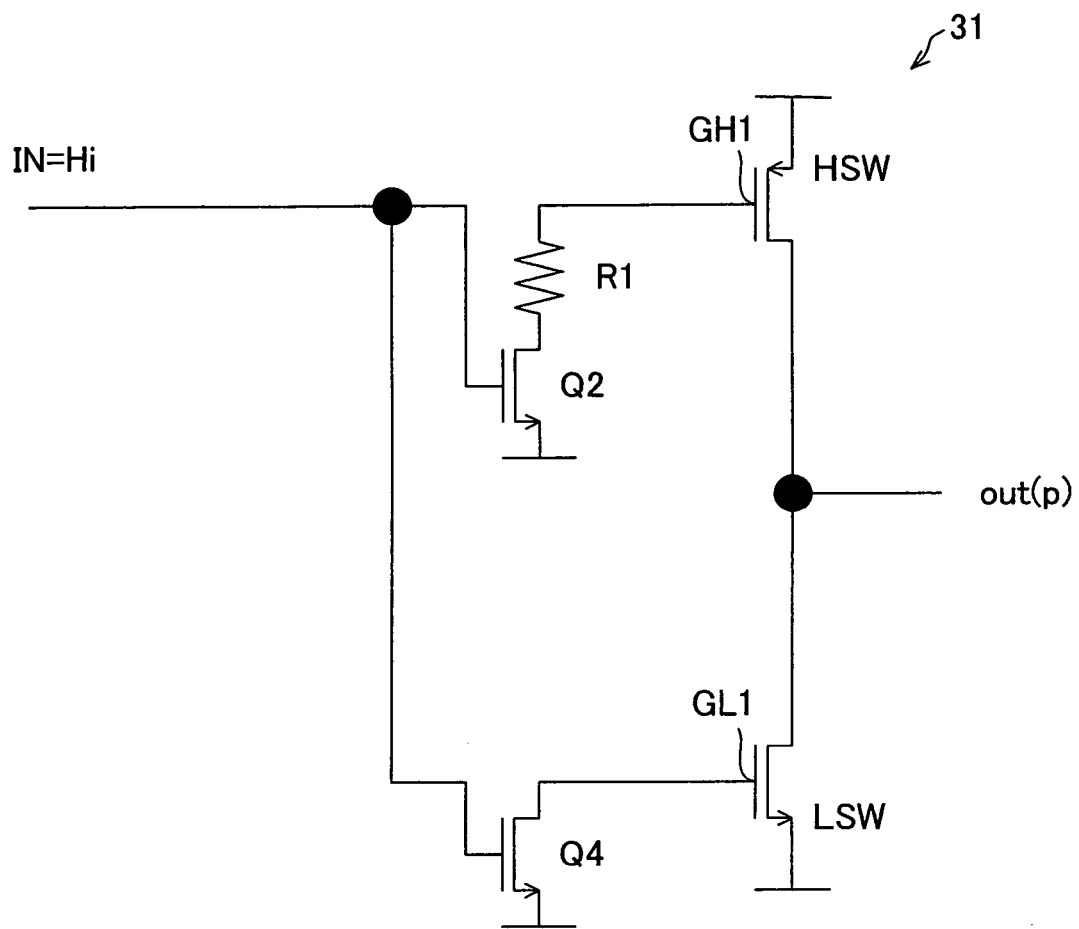
FIG. 4 is a circuit diagram illustrating an equivalent circuit for the switching amplifier circuit in FIG. 2 while the switching amplifier circuit is discharged.
Figure 5:
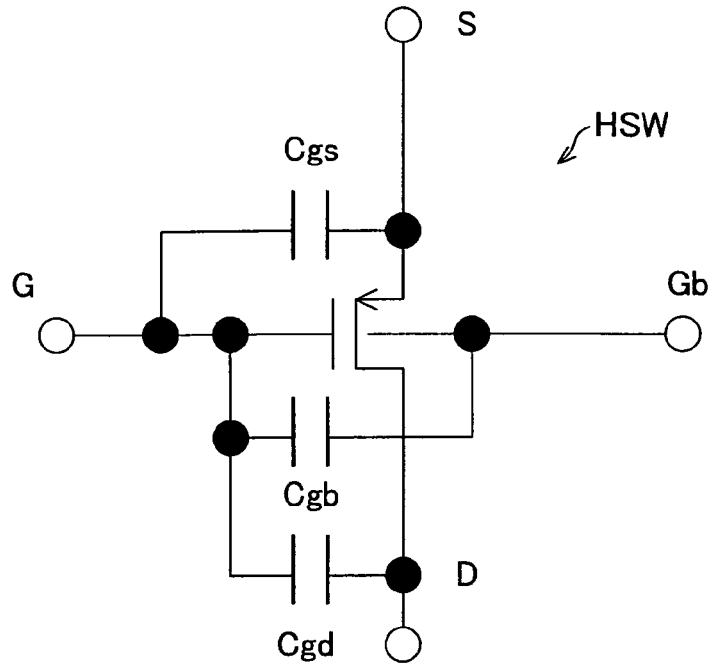
FIG. 5(a) is a circuit diagram illustrating a capacitance model of a pMOS transistor in the class D amplifier.
FIG. 5(b) is a circuit diagram illustrating a capacitance model of an nMOS transistor in the class D amplifier.
Figure 5:
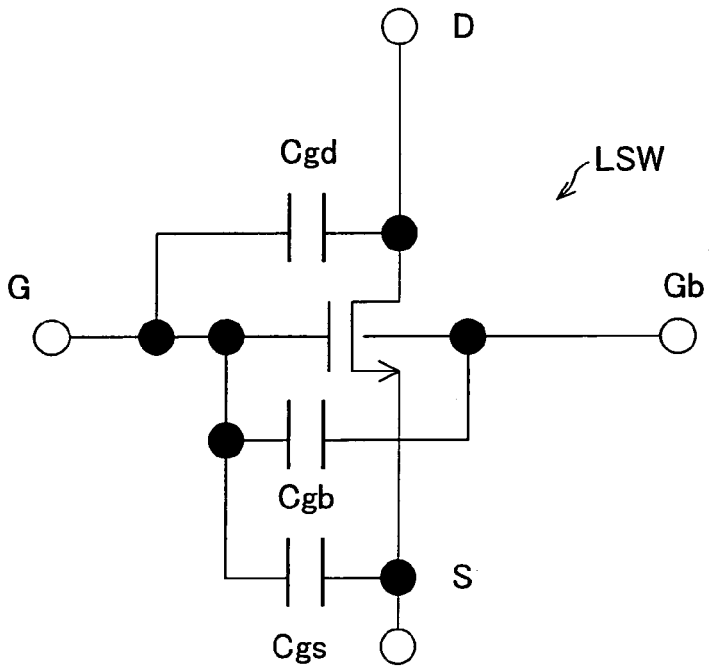

FIG. 4 illustrates an equivalent circuit for the switching amplifier circuit 31 in FIG. 2 while the switching amplifier circuit 31 is discharged.

While discharging the switching amplifier circuit 31, an input signal IN is Hi ("1"). Consequently, the pMOS transistor Q1 is OFF, whereas the nMOS transistor Q2 is ON, so that the resistor R1 is connected with the high side gate GH1. Further, the pMOS transistor Q3 is OFF, whereas the nMOS transistor Q4 is ON, so that the resistor R2 is not connected with the low side gate GL1 (it is the same as a case where the resistor R2 does not exist). The equivalent circuit illustrated in FIG. 4 is formed in this manner.

In the equivalent circuit, the high side gate GH1 is discharged with a time constant (Ron+R01)*Cgg, and the low side gate GL1 is discharged with a time constant Ron *Cgg.

Consequently, a charging time of the high side gate GH1 is shorter than a discharging time of the high side gate GH1, and a charging time of the low side gate GL1 is longer than a discharging time of the low side gate GL1.

FIG. 5(a) illustrates a capacitance model of the pMOS transistor (high side switching element HSW). FIG. 5(b) illustrates a capacitance model of the nMOS transistor (low side switching element LSW).

In the capacitance models illustrated in FIGS. 5(a) and 5(b), Cgg=Cgb+Cgd+Cgs. Here, Cgb is a capacity between a gate and a backgate, Cgd is a capacity between a gate and a drain, and Cgs is a capacity between a gate and a source.

Figure 6:
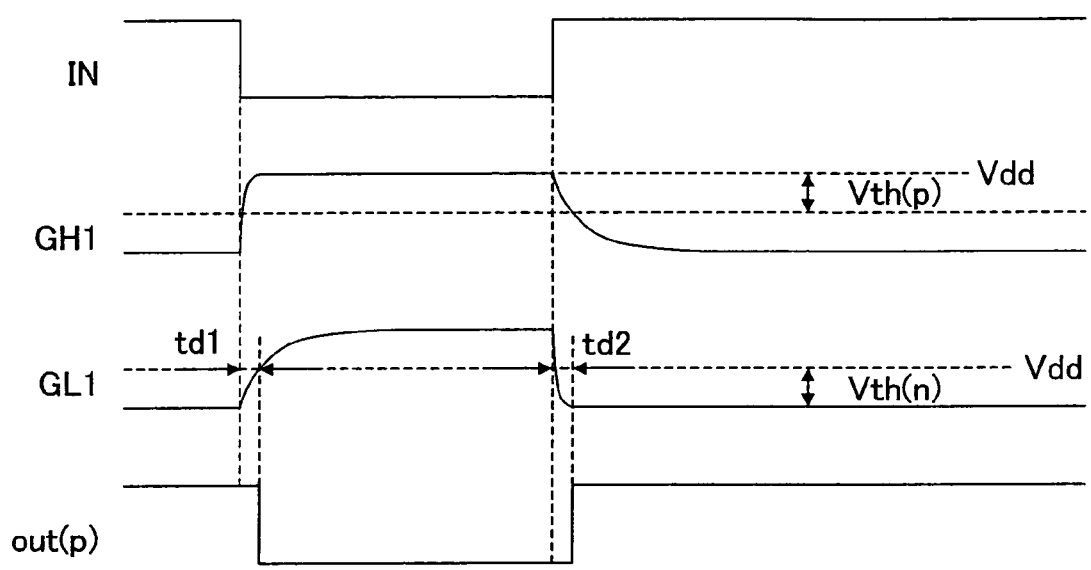
FIG. 6 is a timing chart illustrating an operation of the switching amplifier circuit.

Next, the following explains an operation of the switching amplifier circuit 31 having the above structure. FIG. 6 is a timing chart illustrating the operation of the switching amplifier circuit 31.

As illustrated in FIG. 6, when the potential of the high side gate GH1 drops from a scope ranging from a Hi level (Vdd) to a level lower by a voltage threshold value Vth (p) than the Hi level (Vdd), the high side switching element HSW is turned on. When the potential of the high side gate GH1 is within the scope, the high side switching element HSW is turned off. A time t off(H), which is a time necessary for the high side switching element HSW to be OFF, is represented as follows.

$$t\ off(H)=Ron*Cgg*1n(Vdd/Vth(p))$$

Further, a time t on(H), which is a time necessary for the high side switching element HSW to be ON, is represented as follows.

$$t\ on\ (H)=(Ron+R01)*Cgg*1n(Vdd/Vth(p))$$

As illustrated in FIG. 6, when the potential of the low side gate GL1 rises from a scope ranging from a Lo level to a level higher by a voltage threshold value Vth (n) than the Lo level, the low side switching element LSW is turned on. When the potential of the low side gate GL1 is within the scope, the low side switching element LSW is turned off. If the low side switching element LSW is turned on/off at Vth(n), then a time t on(L), which is a time necessary for the low side switching element LSW to be ON, is represented as follows.

$$t\ on\ (L)=(Ron+R01)*Cgg*1n\ (Vdd/(Vdd-Vth(n)))$$

Further, a time t off(L), which is a time necessary for the low side switching element LSW to be OFF, is represented as follows.

$$t\ off(L)=Ron*Cgg*1n\ (Vdd/(Vdd-Vth(n)))$$

Here, the dead times td1 and td2 are represented as follows.

$$td1=|t\ off(H)-t\ on(L)|$$

$$td2=|t\ on(H)-t\ off(L)|$$

Further, if Vth(p)=Vth(n)=Vdd/2, then the dead times td1 and td2 are represented as follows.

$$td1=td2=R01*Cgg*1n2$$

In this way, in the switching amplifier circuit 31, a dead time can be set by use of the resistors R1 and R2. Therefore, by appropriately setting the resistance value R01 of the resistors R1 and R2 in accordance with the specs of the switching amplifier circuit 31, the most appropriate dead time can be set with a simple structure.

[Embodiment 2]

Figure 7:
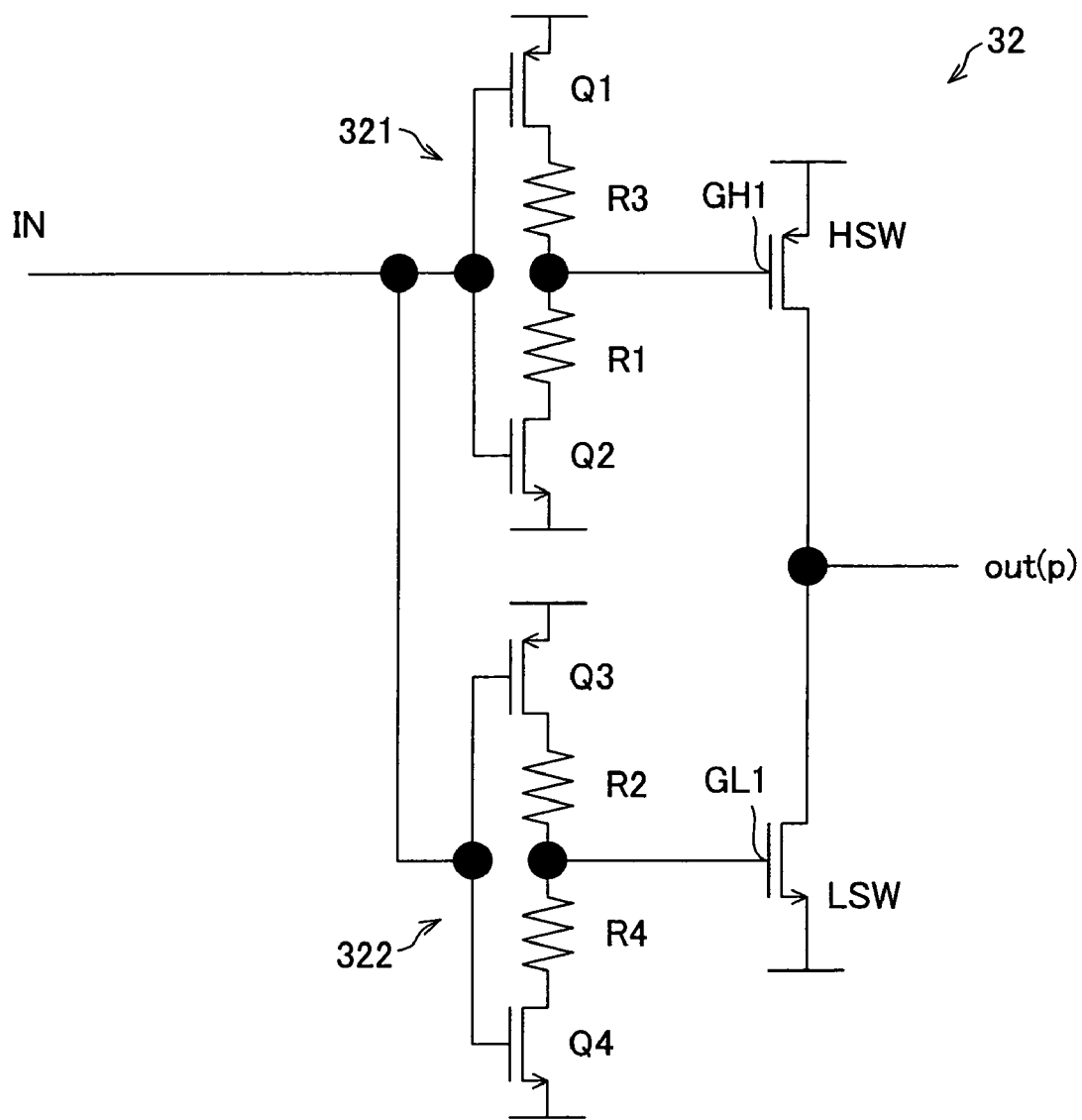
FIG. 7 is a circuit diagram illustrating a structure of a switching amplifier circuit in Embodiment 2 of the class D amplifier.

FIG. 7 illustrates a main structure of a switching amplifier circuit 32 of the present embodiment.

As illustrated in FIG. 7, the switching amplifier circuit 32 includes a high side switching element HSW, a low side switching element LSW, a high side gate driving circuit 321, and a low side gate driving circuit 322.

The high side switching element HSW and the low side switching element LSW in the present embodiment have structures similar to those in Embodiment 1 and therefore explanations of the high side switching element HSW and the low side switching element LSW are omitted here.

Note that, the high side switching element HSW and the low side switching element LSW in embodiments which will be mentioned later have structures similar to those in Embodiment 1 and therefore explanations of the high side switching element HSW and the low side switching element LSW will be omitted in the embodiments.

The high side gate driving circuit 321 is made of an inverter circuit which includes a pMOS transistor Q1, an nMOS transistor Q2, and resistors R1 and R3. The low side gate driving circuit 322 is made of an inverter circuit which includes a pMOS transistor Q3, an nMOS transistor Q4, and resistors R2 and R4. An input signal IN is inputted to respective gates of the pMOS transistor Q1, the nMOS transistor Q2, the pMOS transistor Q3, and the nMOS transistor Q4.

The high side gate driving circuit 321 has a structure in which the resistor R3 is added to the high side gate driving circuit 311 in Embodiment 1. Further, the low side gate driving circuit 322 has a structure in which the resistor R4 is added to the low side gate driving circuit 312 in Embodiment 1. The resistor R3 is connected between the drain of the pMOS transistor Q1 in the high side gate driving circuit 311 and the high side gate GH1. On the other hand, the resistor R4 is connected between the drain of the nMOS transistor Q4 in the low side gate driving circuit 312 and the low side gate GL1.

The resistors R3 and R4 have an identical resistance value R02. Further, the resistance value R01 is set to be greater than the resistance value R02.

The following explains an operation of the switching amplifier circuit 32 having the above structure.

The high side gate GH1 is charged with a time constant (Ron+R02)*Cgg. The low side gate GL1 is charged with a time constant (Ron+R01)*Cgg. The high side gate GH1 is discharged with a time constant (Ron+R01)*Cgg. The low side gate GL1 is discharged with a time constant (Ron+R02)*Cgg.

Consequently, a charging time of the high side gate GH1 is shorter than a discharging time of the high side gate GH1, and a charging time of the low side gate GL1 is longer than a discharging time of the low side gate GL1.

As illustrated in FIG. 6, when the potential of the high side gate GH1 drops from a scope ranging from a Hi level (Vdd) to a level lower by a voltage threshold value Vth (p) than the Hi level (Vdd), the high side switching element HSW is turned on. When the potential of the high side gate GH1 is within the scope, the high side switching element HSW is turned off. A time t off(H), which is a time necessary for the high side switching element HSW to be OFF, is represented as follows.

$$t\ off(H)=(Ron+R02)*Cgg*1n\ (Vdd/Vth(p))$$

Further, a time t on(H), which is a time necessary for the high side switching element HSW to be ON, is represented as follows.

$$t\ on(H)=(Ron+R01)*Cgg*1n\ (Vdd/Vth(p))$$

As illustrated in FIG. 6, when the potential of the low side gate GL1 rises from a scope ranging from a Lo level to a level higher by a voltage threshold value Vth (n) than the Lo level, the low side switching element LSW is turned on. When the potential of the low side gate GL1 is within the scope, the high side switching element HSW is turned off. A time t on(L), which is a time necessary for the low side switching element LSW to be ON, is represented as follows.

$$t\ on\ (L)=(Ron+R01)*Cgg*1n\ (Vdd/(Vdd-Vth\ (n)))$$

Further, a time t off(L), which is a time necessary for the low side switching element LSW to be OFF, is represented as follows.

$$t\ off(L)=(Ron+R02)*Cgg*1n\ (Vdd/(Vdd-Vth(n)))$$

Here, the dead times td1 and td2 are represented as follows.

$$td1=|t\ off(H)-t\ on(L)|$$

$$td2=|t\ on(H)-t\ off(L)|$$

Further, if Vth(p)=Vth(n)=Vdd/2, then the dead times td1 and td2 are represented as follows.

$$td1=td2=(R01-R02)*Cgg*1n2$$

In this way, in the switching amplifier circuit 32, a dead time can be set by use of the resistors R1 to R4. Therefore, by appropriately setting the resistance value R01 of the resistors R1 and R2 and the resistance value R02 of the resistors R3 and R4 in accordance with the specs of the switching amplifier circuit 32, the most appropriate dead time can be set with a simple structure. Further, by using two types of the resistors R01 and R02, the dead time can be set more minutely than the case of the switching amplifier circuit 31.

[Embodiment 3]

Figure 8:
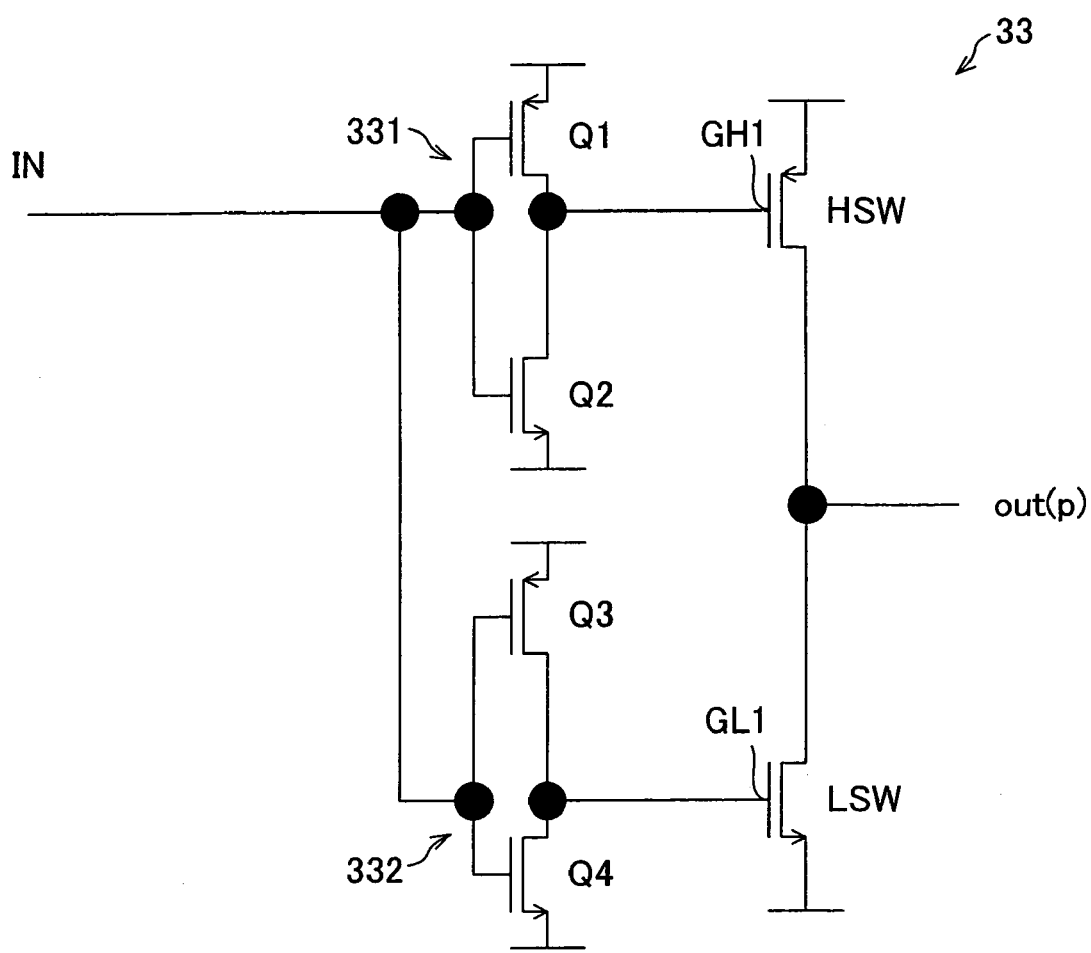
FIG. 8 is a circuit diagram illustrating a structure of a switching amplifier circuit in Embodiment 3 of the class D amplifier.

FIG. 8 illustrates a main structure of a switching amplifier circuit 33 of the present embodiment.

As illustrated in FIG. 8, the switching amplifier circuit 33 includes a high side switching element HSW, a low side switching element LSW, a high side gate driving circuit 331, and a low side gate driving circuit 332.

The high side gate driving circuit 331 is made of an inverter circuit which includes a pMOS transistor Q1 and an nMOS transistor Q2. The low side gate driving circuit 332 is made of an inverter circuit which includes a pMOS transistor Q3 and an nMOS transistor Q4. An input signal IN is inputted to respective gates of the pMOS transistor Q1, the nMOS transistor Q2, the pMOS transistor Q3, and the nMOS transistor Q4. Further, drains of the pMOS transistor Q1 and the nMOS transistor Q2 are connected with the high side gate GH1. Further, drains of the pMOS transistor Q3 and the nMOS transistor Q4 are connected with the low side gate GL1.

Here, assume that gate widths of the nMOS transistors Q2 and Q4 are W1, gate lengths of the nMOS transistors Q2 and Q4 are L1, gate widths of the pMOS transistors Q1 and Q3 are W2, gate lengths of the pMOS transistors Q1 and Q3 are L2. In the high side gate driving circuit 331, W1/L1 is set so as to be smaller than W2/L2. Further, in the low side gate driving circuit 332, W2/L2 is set so as to be smaller than W1/L1.

Ron of the MOS transistor satisfies equations as indicated below.

$$Ron(n)=1/\ (\mu n*Cox*(W1/L1)*(Vgs-Vth2(n)))$$

$$Ron(p)=1/\ (\mu p*Cox*(W2/L2)*(Vgs-Vth2(p)))$$

Note that, each parameter in the equations is defined as follows.

Ron(n): Ron of the nMOS transistor
Ron(p): Ron of the pMOS transistor
μn: channel mobility of the nMOS transistor
μp: channel mobility of the pMOS transistor
Cox: a capacity between a gate and an oxidized film
Vgs: a voltage between a gate and a source
Vth2(n): a voltage threshold value of the nMOS transistor in the gate driving circuit
Vth2(p): a voltage threshold value of the pMOS transistor in the gate driving circuit According to the above equations, Ron can be adjusted by adjusting W1/L1 and W2/L2.

The following explains an operation of the switching amplifier circuit 33 having the above structure.

Here, in order to simplify the situation, assume that ON resistance with respect to each unit W/L is set so that Ron =Ron(p)=Ron(n).

Further, if W/L of the nMOS transistor: W/L of the pMOS transistor=n:1, then ON resistance of the nMOS transistor: ON resistance of the pMOS transistor =Ron: n*Ron. Namely, n represents a ratio of W/L of the nMOS transistor to W/L of the pMOS transistor.

Consequently, the high side gate GH1 is charged with a time constant Ron(p)*Cgg. Further, the low side gate GL1 is charged with a time constant n*Ron(p)*Cgg. Further, the high side gate GH1 is discharged with a time constant n*Ron(n)*Cgg. Further, the low side gate GL1 is discharged with a time constant Ron(n)*Cgg.

Consequently, a charging time of the high side gate GH1 is shorter than a discharging time of the high side gate GH1, and a charging time of the low side gate GL1 is longer than a discharging time of the low side gate GL1.

As illustrated in FIG. 6, when the potential of the high side gate GH drops from a scope ranging from a Hi level (Vdd) to a level lower by a voltage threshold value Vth (p) than the Hi level (Vdd), the high side switching element HSW is turned on. When the potential of the high side gate GH is within the scope, the high side switching element HSW is turned off. A time t off(H), which is a time necessary for the high side switching element HSW to be OFF, is represented as follows.

$$t\ off(H)=Ron^*Cgg^*1n\ (Vdd/Vth(p))$$

Further, a time t on(H), which is a time necessary for the high side switching element HSW to be ON, is represented as follows.

$$t\ on(H)=n^*Ron^*Cgg^*1n\ (Vdd/Vth(p))$$

As illustrated in FIG. 6, when the potential of the low side gate GL rises from a scope ranging from a Lo level to a level higher by a voltage threshold value Vth (n) than the Lo level, the low side switching element LSW is turned on. When the potential of the low side gate GL is within the scope, the low side switching element LSW is turned off. A time t on(L), which is a time necessary for the low side switching element LSW to be ON, is represented as follows.

$$t\ on\ (L)=n^*Ron^*Cgg^*1n\ (Vdd/(Vdd-Vth(n)))$$

Further, a time t off(L), which is a time necessary for the low side switching element LSW to be OFF, is represented as follows.

$$t\ off(L)=Ron^*Cgg^*1n\ (Vdd/(Vdd-Vth(n)))$$

Here, the dead times td1 and td2 are represented as follows.

$$td1=|t\ off(H)-t\ on(L)|$$

$$td2=|t\ on(H)-t\ off(L)|$$

Further, if Vth(p)=Vth(n)=Vdd/2, then the dead times td1 and td2 are represented as follows.

$$td1=td2=|(n-1)|^*Ron^*Cgg^*1n2$$

In this way, in the switching amplifier circuit 33, a dead time can be set by adjusting n which is a ratio of W/L of the nMOS transistor to W/L of the pMOS transistor. Therefore, by appropriately setting W1/L1 and W2/L2 in accordance with the specs of the switching amplifier circuit 33, the most appropriate dead time can be set with a simple structure. Further, the switching amplifier circuit 33 does not need the resistors R1 and R2 unlike the switching amplifier circuits 31 and 32 and therefore has a simple structure.

[Embodiment 4]

Figure 9:
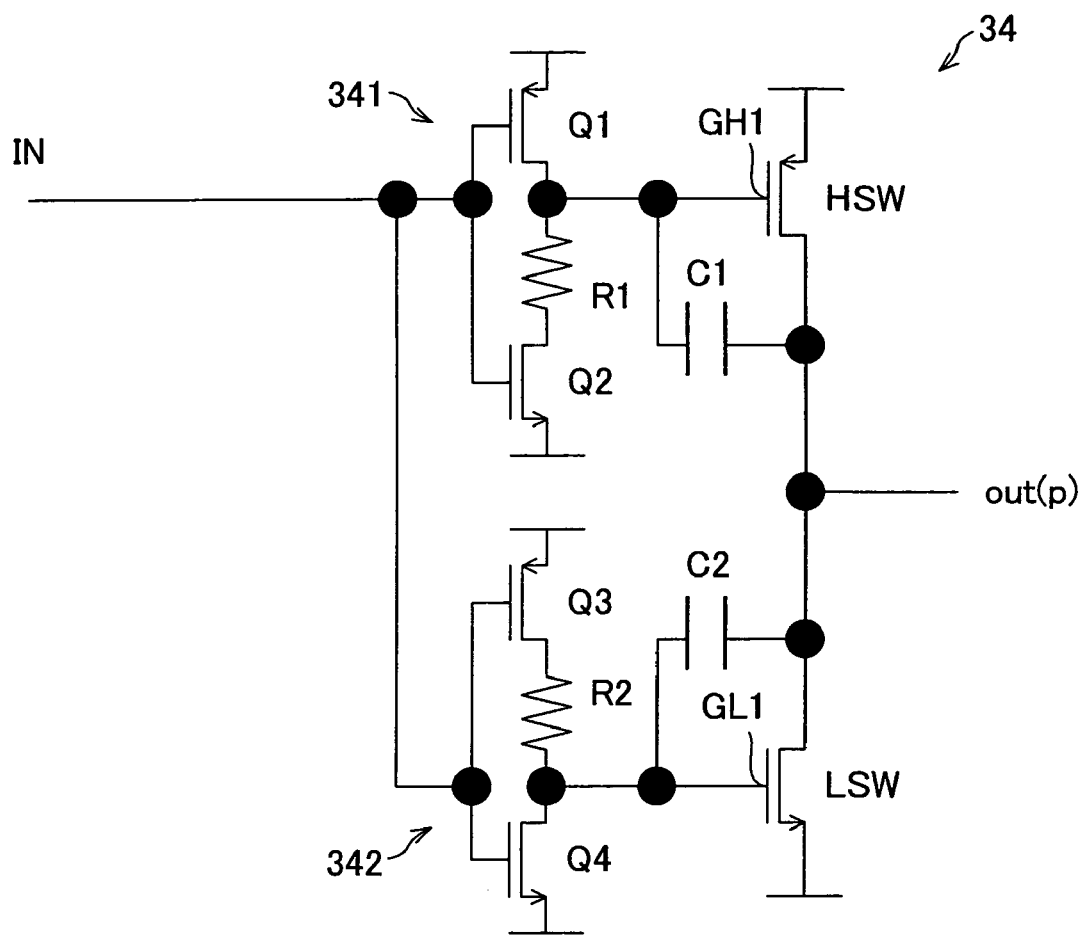
FIG. 9 is a circuit diagram illustrating a structure of a switching amplifier circuit in Embodiment 4 of the class D amplifier.

FIG. 9 illustrates a main structure of a switching amplifier circuit 34 of the present embodiment.

As illustrated in FIG. 9, the switching amplifier circuit 34 includes a high side switching element HSW, a low side switching element LSW, a high side gate driving circuit 341, and a low side gate driving circuit 342.

The high side gate driving circuit 341 is made of an inverter circuit which includes a pMOS transistor Q1, an nMOS transistor Q2, a resistor R1, and a capacitor C1. The low side gate driving circuit 342 is made of an inverter circuit which includes a pMOS transistor Q3, an nMOS transistor Q4, a resistor R2, and a capacitor C2. An input signal IN is inputted to respective gates of the pMOS transistor Q1, the nMOS transistor Q2, the pMOS transistor Q3, and the nMOS transistor Q4.

The high side gate driving circuit 341 has a structure in which the capacitor C1 is added to the high side gate driving circuit 311 in Embodiment 1. Further, the low side gate driving circuit 342 has a structure in which the capacitor C2 is added to the low side gate driving circuit 312 in Embodiment 1. The capacitor C1 is connected between a gate and a drain of the high side switching element HSW. On the other hand, the capacitor C2 is connected between a gate and a drain of the low side switching element LSW.

The capacitors C1 and C2 have an identical capacitance C0.

The following explains an operation of the switching amplifier circuit 34 having the above structure.

The high side gate GH1 is charged with a time constant Ron*(Cgg+C0). The low side gate GL1 is charged with a time constant (Ron+R01)*(Cgg+C0). The high side gate GH1 is discharged with a time Constant (Ron+R01)*(Cgg+C0). The low side gate GL1 is discharged with a time constant Ron*(Cgg+C0).

Consequently, a charging time of the high side gate GH1 is shorter than a discharging time of the high side gate GH1, and a charging time of the low side gate GL1 is longer than a discharging time of the low side gate GL1.

As illustrated in FIG. 6, when the potential of the high side gate GH drops from a scope ranging from a Hi level (Vdd) to a level lower by a voltage threshold value Vth (p) than the Hi level (Vdd), the high side switching element HSW is turned on. When the potential of the high side gate GH is within the scope, the high side switching element HSW is turned off. A time t off(H), which is a time necessary for the high side switching element HSW to be OFF, is represented as follows.

$$t\ off\ (H)=Ron^*(Cgg+C0)^*1n\ (Vdd/Vth(p))$$

Further, a time t on(H), which is a time necessary for the high side switching element HSW to be ON, is represented as follows.

$$t\ on(H)=(Ron+R01)^*(Cgg+C0)^*1n\ (Vdd/Vth(p))$$

As illustrated in FIG. 6, when the potential of the low side gate GL rises from a scope ranging from a Lo level to a level higher by a voltage threshold value Vth (n) than the Lo level, the low side switching element LSW is turned on. When the potential of the low side gate GL is within the scope, the low side switching element LSW is turned off. A time t on(L), which is a time necessary for the low side switching element LSW to be ON, is represented as follows.

$$t\ on\ (L)=(Ron+R01)^*(Cgg+C0)^*1n\ (Vdd/(Vdd-Vth(n)))$$

Further, a time t off(L), which is a time necessary for the low side switching element LSW to be OFF, is represented as follows.

$$t\ off(L)=Ron^*(Cgg+C0)^*1n\ (Vdd/(Vdd-Vth(n)))$$

Here, the dead times td1 and td2 are represented as follows.

$$td1=|t\ off(H)-t\ on(L)|$$

$$td2=|t\ on(H)-t\ off(L)|$$

Further, if Vth(p)=Vth(n)=Vdd/2, then the dead times td1 and td2 are represented as follows.

$$td1=td2=R01^*(Cgg+C0)^*1n2$$

In this way, in the switching amplifier circuit 34, a dead time can be set by use of the resistors R1 and R2 and the capacitors C1 and C2. Therefore, by appropriately setting the resistance value R01 of the resistors R1 and R2 and the capacitance CO of the capacitors C1 and C2 in accordance with the specs of the switching amplifier circuit 34, the most appropriate dead time can be set with a simple structure.

Further, in a general integrated circuit process, variations in capacitance (e.g. ±10%) are smaller than variations in a resistance value (e.g. ±20%). Therefore, by adding capacitance to parameters for setting a dead time, it is possible to reduce the influence of variations in characteristics of the element, compared with the switching amplifier circuit 31 in Embodiment 1.

Note that, in the present embodiment, an explanation is made as to a structure in which the capacitors C1 and C2 are added to the switching amplifier circuit 31 in Embodiment 1. However, the present embodiment may be arranged so that the capacitors C1 and C2 are added to the switching amplifier circuit 32 in Embodiment 2.

[Embodiment 5]

Figure 10:
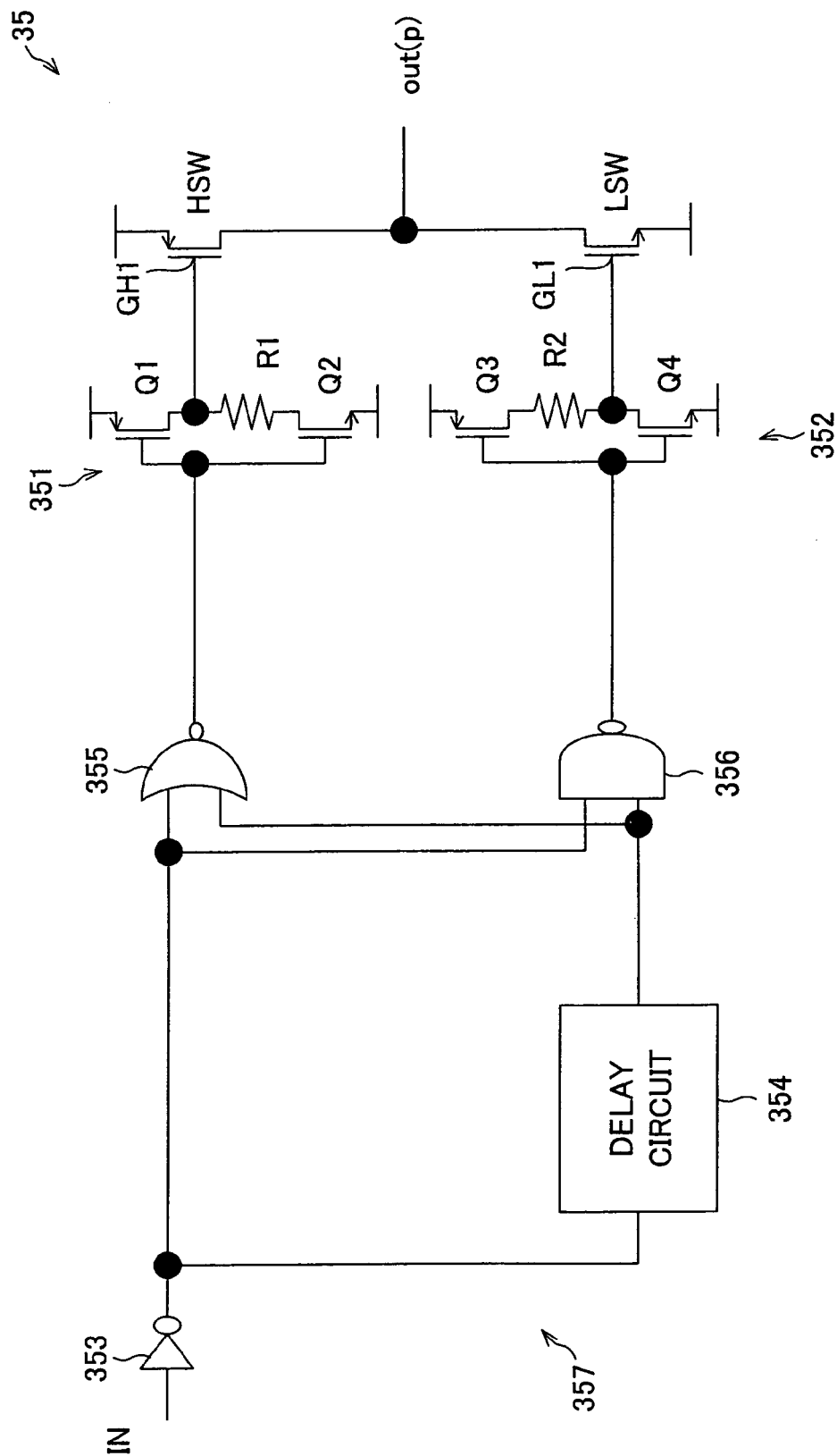
FIG. 10 is a circuit diagram illustrating a structure of a switching amplifier circuit in Embodiment 5 of the class D amplifier.

FIG. 10 illustrates a main structure of a switching amplifier circuit 35 of the present embodiment.

As illustrated in FIG. 10, the switching amplifier circuit 35 includes a high side switching element HSW, a low side switching element LSW, a high side gate driving circuit 351, a low side gate driving circuit 352, an inverter 353, a delay circuit 354, an NOR circuit 355, and an NAND circuit 356. The inverter 353, the delay circuit 354, the NOR circuit 355, and the NAND circuit 356 constitute a dead time generating circuit 357 (delay time providing circuit).

Just like the high side gate driving circuit 311, the high side gate driving circuit 351 is made of an inverter circuit which includes a pMOS transistor Q1, an nMOS transistor Q2, and a resistor R1. Just like the low side gate driving circuit 312, the low side gate driving circuit 352 is made of an inverter circuit which includes a pMOS transistor Q3, an nMOS transistor Q4, and a resistor R2.

The delay circuit 354 delays, for a predetermined delay time, an input signal IN which has been inverted by the inverter 353. The NOR circuit 355 outputs a logical NOR between the input signal IN which has been inverted by the inverter 353 and the input signal IN which has been delayed by the delay circuit 354. The NAND circuit 356 outputs a logical NAND between the input signal IN which has been inverted by the inverter 353 and the input signal IN which has been delayed by the delay circuit 354.

Further, an output end of the NOR circuit 355 is connected with gates of the pMOS transistor Q1 and the nMOS transistor Q2. On the other hand, an output end of the NAND circuit 356 is connected with gates of the pMOS transistor and the nMOS transistor Q4.

The following explains an operation of the switching amplifier circuit 35 having the above structure.

Figure 11:
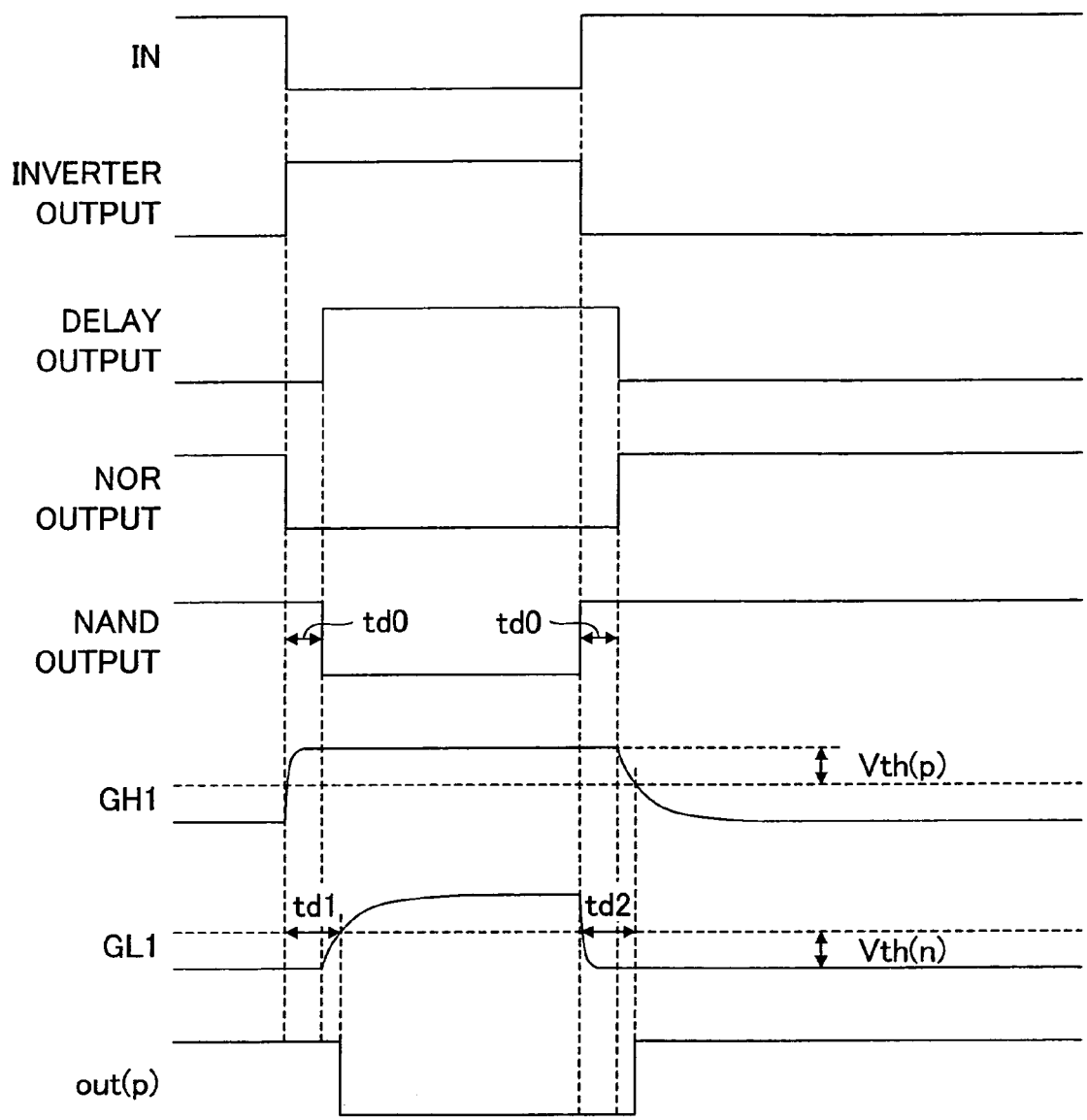
FIG. 11 is a timing chart illustrating an operation of the switching amplifier circuit in FIG. 10.

The input signal IN which has been inverted by the inverter 353 is inputted to the NOR circuit 355 and the NAND circuit 356 as it is, whereas the input signal IN is delayed by the delay circuit 354 for a predetermined time and then is inputted to the NOR circuit 355 and the NAND circuit 356. Consequently, as illustrated in FIG. 11, the NOR circuit 355 outputs a logical NOR between an output of the inverter 353 (inverter output) and an output of the delay circuit 354 (delay output). Further, the NAND circuit 356 outputs a logical NAND between the inverter output and the delay output. As a result, a logic level of a high side gate GH1 is Hi while the NOR output is Lo, so that the high side switching element HSW is OFF. On the other hand, a logic level of a low side gate GL1 is Hi while the NAND output is Lo, so that the low side switching element LSW is ON.

Here, the NOR output falls from Hi to Lo and after a delay time td0 given by the delay circuit 354, the NAND output falls from Hi to Lo. Further, the NAND output rises from Lo to Hi and after the delay time td0, the NOR output rises from Lo to Hi.

On the other hand, in the high side gate driving circuit 351 and the low side gate driving circuit 352, just like in the high side gate driving circuit 311 and the low side gate driving circuit 312, dead times td1 and td2 are set by use of resisters R1 and R2. Therefore, in the switching amplifier circuit 35, the dead times td1 and td2 which include delay time td0 are set as indicated below.

$$td1 = td0 + |t\,off(H) - t\,on(L)|$$

$$td2 = td0 + |t\,on(H) - t\,off(L)|$$

Further, if Vth(p)=Vth(n)=Vdd/2, then the dead times td1 and td2 are represented as follows.

$$td1 = td2 = td0 + R1*Cgg*\ln 2$$

Consequently, during a period from a time when the logic level of the high side gate GH1 changes to Hi to a time when the logic level of the low side gate GL1 changes to Hi, the high side switching element HSW and the low side switching element LSW are OFF. In the same way, during a period from a time when the logic level of the low side gate GL1 changes to Lo to a time when the logic level of the high side gate GH1 changes to Lo, the high side switching element HSW and the low side switching element LSW are OFF.

In this way, in the switching amplifier circuit 35, a dead time can be set by use of the resistors R1 and R2, the inverter 353, the delay circuit 354, the NOR circuit 355, and the NAND circuit 356. Therefore, by appropriately setting a resistance value R01 of the resistors R1 and R2 and a delay time of the delay circuit 354 in accordance with the specs of the switching amplifier circuit 35, the most appropriate dead time can be set.

Note that, the resistance value R01 is limited because of spec values of (i) a falling time trd of a potential of the high side gate GH (a time t on(H) necessary for the high side switching element HSW to be ON) and (ii) a rising time tru of a potential of the low side gate GL (a time t on(H) necessary for the low side switching element LSW to be ON). For example, the falling time trd and the rising time tru are represented as follows.

$$trd = t\,on(H) = (Ron + R01)*Cgg*\ln(Vdd/Vth(p))$$

$$tru = t\,on(L) = (Ron + R01)*Cgg*\ln(Vdd/(Vdd - Vth(n)))$$

Consequently, if the resistance value R01 is made larger so that the dead times td1 and td2 becomes longer, there is a case where the falling time trd and the rising time tru do not satisfy the spec values. In order to avoid such inconvenience, the delay time td0 of the delay circuit 354 should be set to be longer instead of making the resistance value R01 larger. Consequently, it is possible to set the dead times td1 and td2 to be longer while satisfying the spec values of the falling time trd and the rising time tru.

Further, the arrangement of the present embodiment can be applied to the arrangements of Embodiments 2 to 4. To be specific, the switching amplifier circuits 32 to 34 are combined with the dead time generating circuit 357. By appropriately setting the delay time td0 and the dead times set in the switching amplifier circuits 32 to 34, an appropriate dead time can be set in accordance with the specs of the switching amplifier circuits 32 to 34 and the switching elements HSW and LSW. In particular, in the switching amplifier circuits 32 and 34 which use the resistance values R01 and R02, it is possible to set the dead times td1 and td2 to be longer while satisfying the spec values of the falling time trd and the rising time tru, just like in the present embodiment.

[Embodiment 6]

Figure 12:
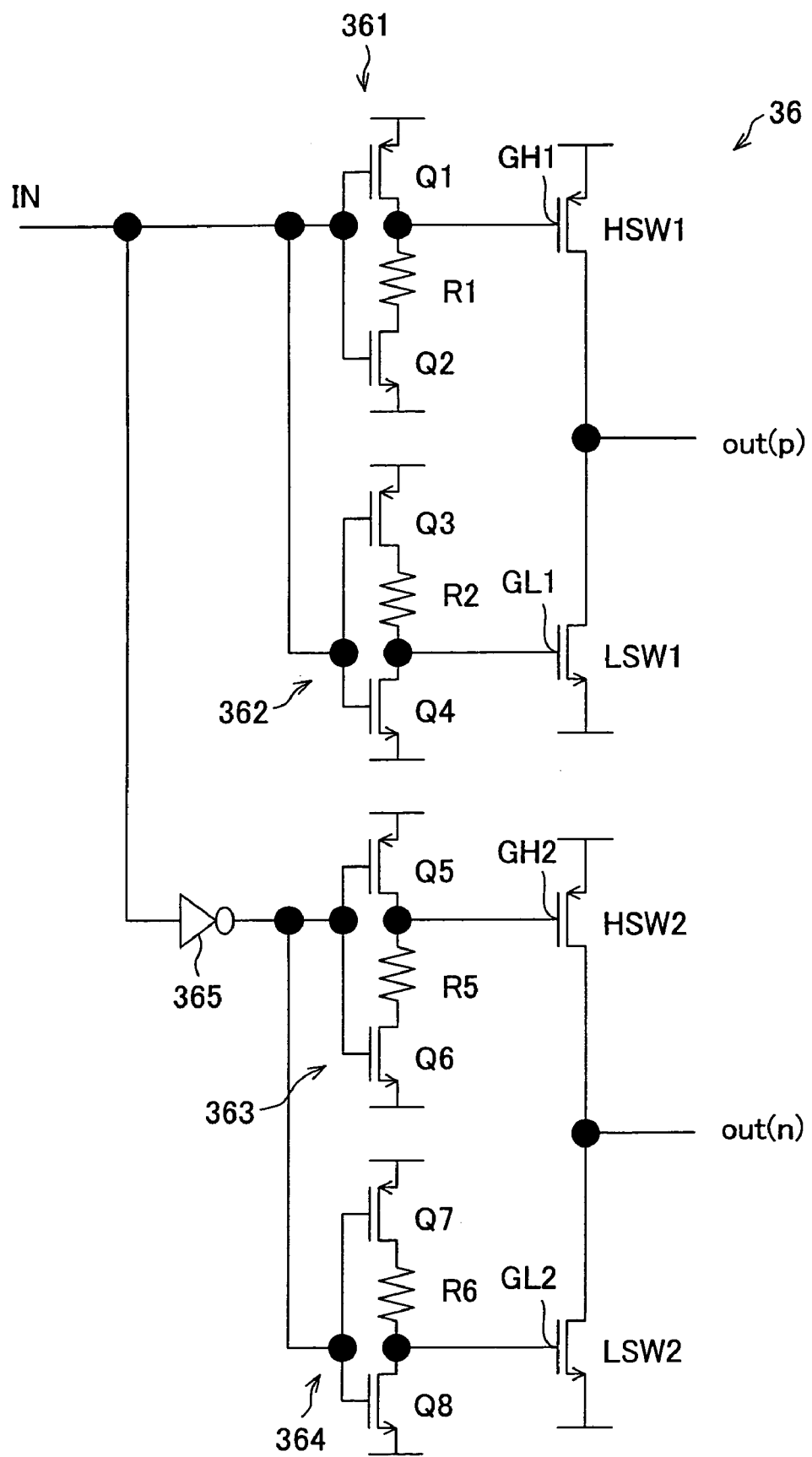
FIG. 12 is a circuit diagram illustrating a structure of a switching amplifier circuit in Embodiment 6 of the class D amplifier.

FIG. 12 illustrates a main structure of a switching amplifier circuit 36 of the present embodiment.

As illustrated in FIG. 12, the switching amplifier circuit 36 includes high side switching elements HSW1 and HSW2, low side switching elements LSW1 and LSW2, high side gate driving circuits 361 and 363, low side gate driving circuits 362 and 364, and an inverter 365.

The high side switching elements HSW1 and HSW2 have the same functions as the high side switching element HSW explained in the previous embodiments. On the other hand, the low side switching elements LSW1 and LSW2 have the same functions as the low side switching element LSW explained in the previous embodiments. Further, an output signal out(p) is outputted from respective drains of the high side switching element HSW1 and the low side switching element LSW1. An inverted output signal out(n) is outputted from respective drains of the high side switching element HSW2 and the low side switching element LSW2.

The high side gate driving circuit 361 is made of an inverter circuit which includes a pMOS transistor Q1, an nMOS transistor Q2, and a resistor R1 and which is the same as the high side gate driving circuit 311. The low side gate driving circuit 362 is made of an inverter circuit which includes a pMOS transistor Q3, an nMOS transistor Q4, and a resistor R2 and which is the same as the low side gate driving circuit 312. An input signal IN is inputted to respective gates of the pMOS transistor Q1, the nMOS transistor Q2, the pMOS transistor Q3, and the nMOS transistor Q4.

The high side gate driving circuit 363 is made of an inverter circuit which includes a pMOS transistor Q5, an nMOS transistor Q6, and a resistor R5. The low side gate driving circuit 364 is made of an inverter circuit which includes a pMOS transistor Q7, an nMOS transistor Q8, and a resistor R6. An input signal IN which has been inverted by the inverter 365 is inputted to respective gates of the pMOS transistor Q5, the nMOS transistor Q6, the pMOS transistor Q7, and the nMOS transistor Q8.

Just like the high side gate driving circuit 361, the high side gate driving circuit 363 is made of an inverter circuit which is the same as the high side gate driving circuit 311. Further, just like the low side gate driving circuit 362, the low side gate driving circuit 364 is made of an inverter circuit which is the same as the low side gate driving circuit 312. Therefore, just like the resistor R1, the resistor R5 has a resistance value R01, and just like the resistor R2, the resistor R6 has a resistance value R02.

Figure 13:
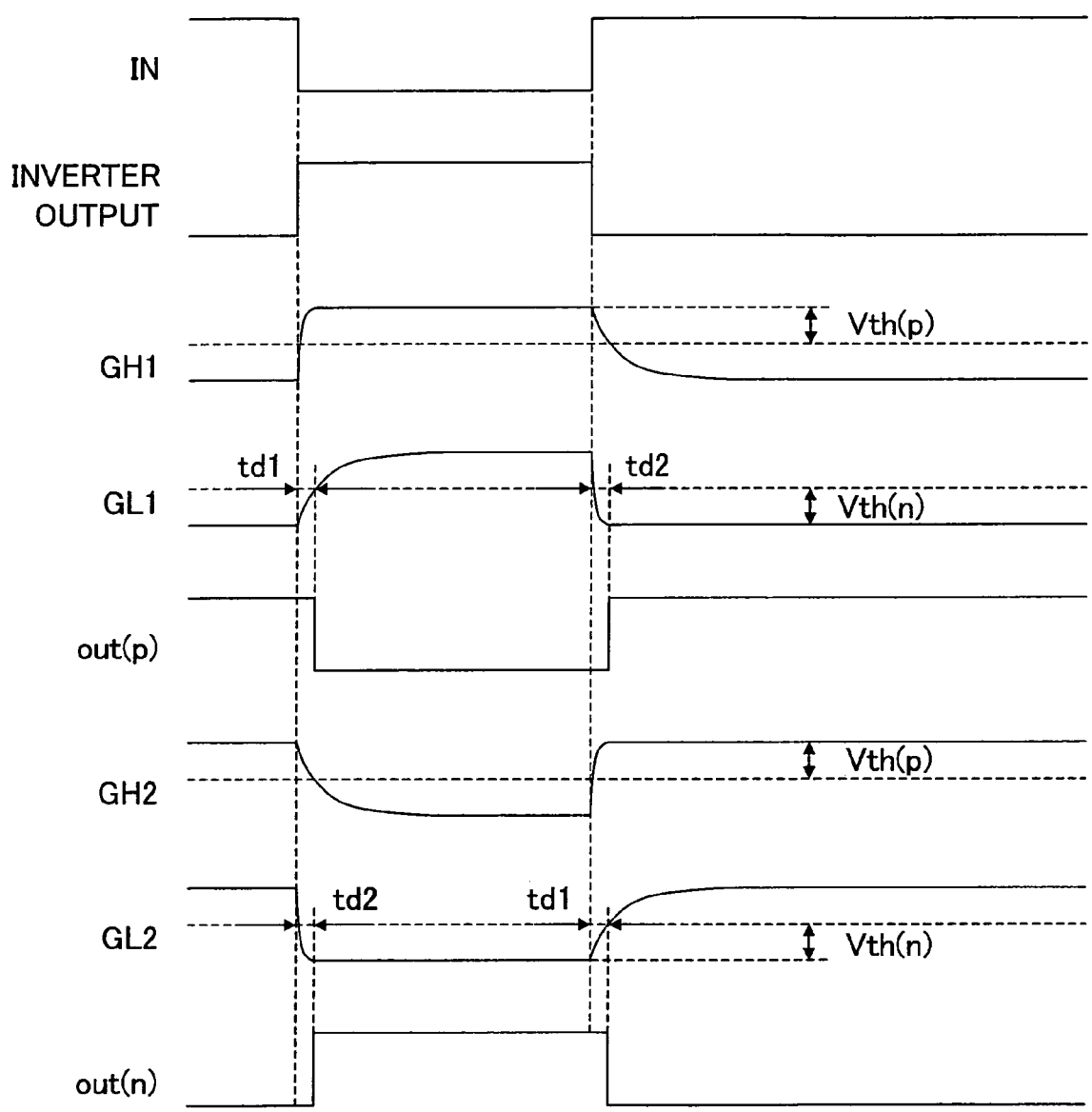
FIG. 13 is a timing chart illustrating an operation of the switching amplifier circuit in FIG. 12.

The following explains an operation of the switching amplifier circuit 36 having the above structure. FIG. 13 is a timing chart which illustrates the operation of the switching amplifier circuit 36.

As illustrated in FIG. 13, the high side gate GH1 and the low side gate GL1 are driven in response to the input signal IN. On the other hand, the high side gate GH2 and the low side gate GL2 are driven in response to the input signal IN having been inverted, namely, an output of the inverter 365 (inverter output). Consequently, the switching amplifier circuit 36 outputs the output signal out(p) and the inverted output signal out(n). This allows adoption of a full-bridge type low pass filter 4.

Note that, in the present embodiment, an explanation is made as to an example in which the arrangement of the switching amplifier circuit 31 (the high side gate driving circuit 311 and the low side gate driving circuit 312) is applied to the high side gate driving circuits 361 and 363 and the low side gate driving circuits 362 and 364. However, the present embodiment is not limited to this example and may be arranged so that: the arrangements of the switching amplifier circuits 32 to 34 are applied to the high side gate driving circuits 361 and 363 and the low side gate driving circuits 362 and 364 so as to correspond to the full-bridge type low pass filter 4.

[Embodiment 7]

Figure 14:
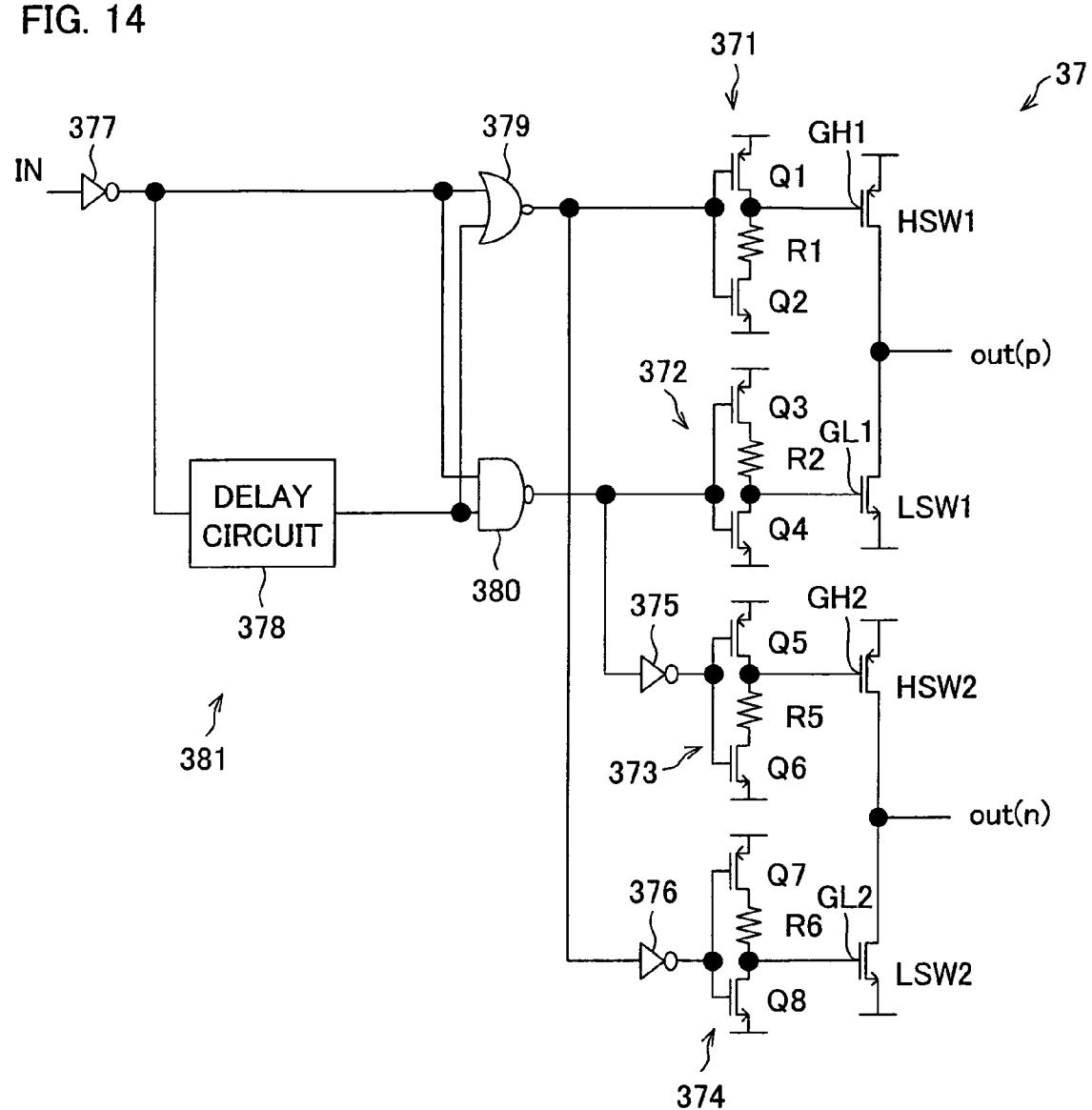
FIG. 14 is a circuit diagram illustrating a structure of a switching amplifier circuit in Embodiment 7 of the class D amplifier.

FIG. 14 illustrates a main structure of a switching amplifier circuit 37 of the present embodiment.

As illustrated in FIG. 14, the switching amplifier circuit 37 includes high side switching elements HSW1 and HSW2, low side switching elements LSW1 and LSW2, high side gate driving circuits 371 and 373, low side gate driving circuits 372 and 374, and inverters 375 and 376. The high side gate driving circuits 371 and 373 have the same structures as the high side gate driving circuits 361 and 363. The low side gate driving circuits 372 and 374 have the same structures as the low side gate driving circuits 362 and 364. Therefore, explanations thereof are omitted here.

Further, the switching amplifier circuit 37 includes an inverter 377, a delay circuit 378, an NOR circuit 379, and an NAND circuit 380, each of which constitutes a dead time generating circuit 381 (delay time providing circuit). The inverter 377, the delay circuit 378, the NOR circuit 379, and the NAND circuit 380 are made of the same circuits as the inverter 353, the delay circuit 354, the NOR circuit 355, and the NAND circuit 356, respectively, of the switching amplifier circuit 35. Therefore, just like the switching amplifier circuit 35, the switching amplifier circuit 37 has a function for generating a dead time by use of a delay time td0.

One output terminal of the NOR circuit 379 is connected with an input terminal of the high side gate driving circuit 371 and the other output terminal of the NOR circuit 379 is connected with an input terminal of the low side gate driving circuit 374 via the inverter 376. On the other hand, one output terminal of the NAND circuit 380 is connected with an input terminal of the low side gate driving circuit 372 and the other output terminal of the NAND circuit 380 is connected with an input terminal of the high side gate driving circuit 373 via the inverter 375.

Figure 15:
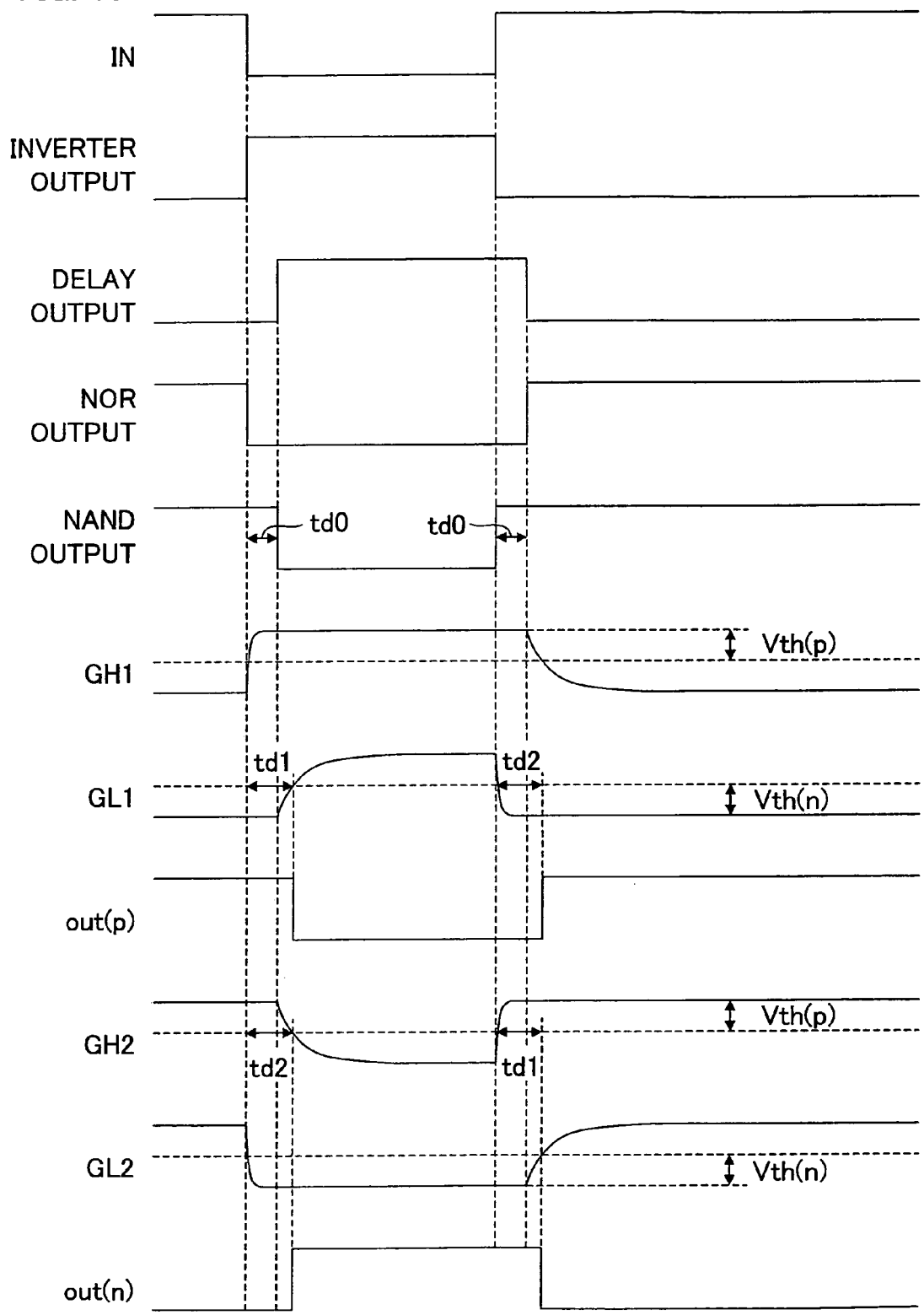
FIG. 15 is a timing chart illustrating an operation of the switching amplifier circuit in FIG. 14.

The following explains an operation of the switching amplifier circuit 37 having the above structure. FIG. 15 is a timing chart which illustrates the operation of the switching amplifier circuit 37.

The input signal IN which has been inverted by the inverter 377 is inputted to the NOR circuit 379 and the NAND circuit 380 as it is, whereas the input signal IN is delayed by the delay circuit 378 for a predetermined time. An output of the delay circuit 378 (delay output) is inputted to the NOR circuit 379 and the NAND circuit 380. Consequently, as illustrated in FIG. 15, the NOR circuit 379 outputs a logical NOR between an output of the inverter 377 (inverter output) and an output of the delay circuit 378 (delay output). Further, the NAND circuit 380 outputs a logical NAND between the inverter output and the delay output.

As a result, a logic level of a high side gate GH1 is Hi while the NOR output is Lo, so that the high side switching element HSW1 is OFF. Further, a logic level of a low side gate GL2 is Lo while the NOR output which has been inverted by the inverter 376 is Hi, so that the low side switching element LSW2 is OFF. On the other hand, a logic level of a low side gate GL1 is Hi while the NAND output is Lo, so that the low side switching element LSW1 is ON. Further, a logic level of a high side gate GH2 is Lo while the NAND output which has been inverted by the inverter 375 is Hi, so that the high side switching element HSW2 is ON.

Here, the NOR output falls from Hi to Lo and after a delay time td0 given by the delay circuit 378, the NAND output falls from Hi to Lo. Further, the NAND output rises from Lo to Hi and after a delay time td0 the NOR output rises from Lo to Hi.

On the other hand, in the high side gate driving circuits 371 and 373 and the low side gate driving circuits 372 and 374, just like in the high side gate driving circuit 311 and the low side gate driving circuit 312, dead times td1 and td2 are set by use of resisters R1 and R2. Therefore, in the switching amplifier circuit 37, just like in the switching amplifier circuit 35, the dead times td1 and td2 which include delay time td0 are set.

Consequently, during a period from a time when the logic level of the high side gate GH1 changes to Hi to a time when the logic level of the low side gate GL1 changes to Hi, the high side switching element HSW1 and the low side switching element LSW1 are OFF. In the same way, during a period from a time when the logic level of the low side gate GL1 changes to Lo to a time when the logic level of the high side gate GH1 changes to Lo, the high side switching element HSW1 and the low side switching element LSW1 are OFF.

Further, during a period from a time when the logic level of the low side gate GL2 changes to Lo to a time when the logic level of the high side gate GH2 changes to Lo, the high side switching element HSW2 and the low side switching element LSW2 are OFF. In the same way, during a period from a time when the logic level of the high side gate GH2 changes to Hi to a time when the logic level of the low side gate GH2 changes to Hi, the high side switching element HSW2 and the low side switching element LSW2 are OFF.

As illustrated in FIG. 15, the high side gate GH1 is driven in response to the NOR output, and the low side gate GL2 is driven in response to the NOR output which has been inverted. On the other hand, the low side gate GL1 is driven in response to the NAND output, and the high side gate GH2 is driven in response to the NAND output which has been inverted. Consequently, the switching amplifier circuit 37 outputs the output signal out(p) and the inverted output signal out(n). This allows adoption of a full-bridge type low pass filter 4.

[Embodiment 8]

Figure 16:
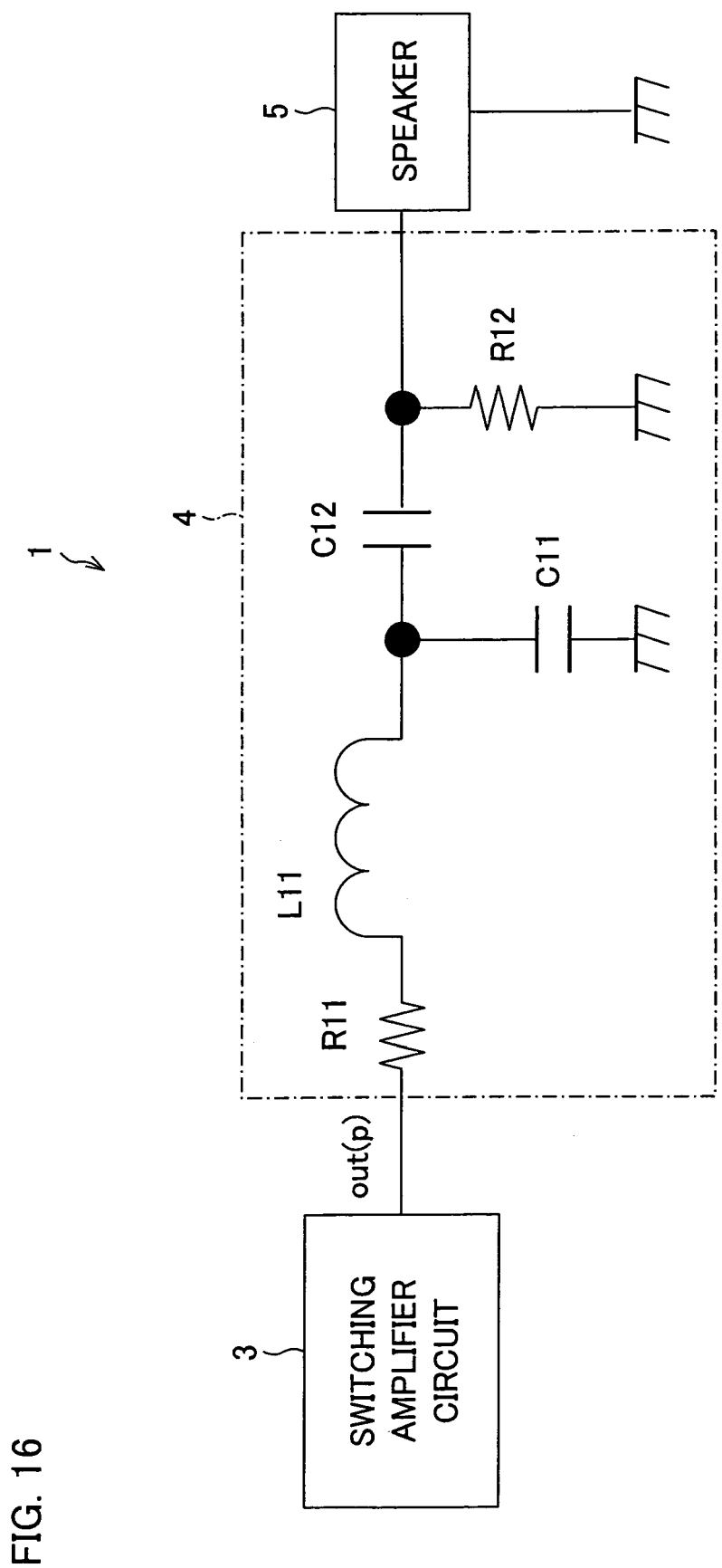
FIG. 16 is a circuit diagram illustrating a structure of a half-bridge type low pass filter in the class D amplifier.

FIG. 16 illustrates in detail an example of a structure of a low pass filter 4 in the class D amplifier 1 illustrated in FIG. 1. Further, FIG. 17 illustrates in detail another example of a structure of the low pass filter 4 in the class D amplifier 1 illustrated in FIG. 1.

The low pass filter 4 illustrated in FIG. 16 includes resistors R11 and R12, a coil L11, and capacitors C11 and C12. The resistor R11, the coil L11, and the capacitor C12 are connected in series between a switching amplifier circuit 3 and a speaker 5. One electrode of the capacitor C11 is connected between the coil L11 and the capacitor C12, and the other electrode of the capacitor C11 is grounded.

The low pass filter 4 having the above structure is a half-bridge type low pass filter and averages an output signal out(p) which is outputted from the switching amplifier circuit 3.

Figure 17:
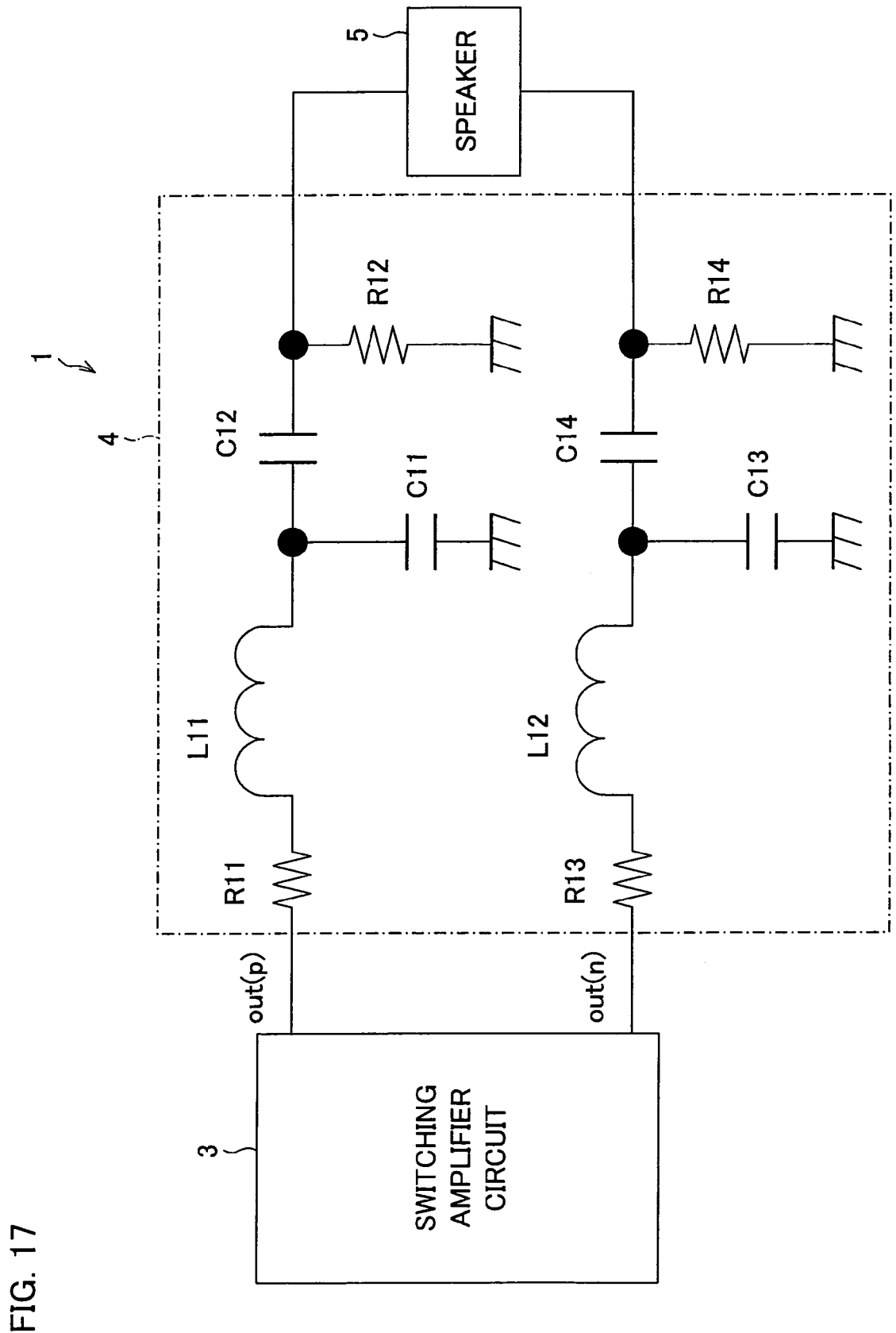
FIG. 17 is a circuit diagram illustrating a structure of a full-bridge type low pass filter in the class D amplifier.

On the other hand, the low pass filter 4 illustrated in FIG. 17 includes resistors R11 to R14, coils L11 and L12, and capacitors C11 to C14. In the low pass filter 4, the resistors R11 and R12, the coil L11 and the capacitors 11 and 12 constitute a low pass filter identical with the low pass filter in FIG. 16, and the resistors R13 and R14, the coil L12 and the capacitors C13 and C14 constitute a low pass filter identical with the low pass filter in FIG. 16.

The low pass filter 4 having the above structure is a full-bridge type low pass filter and averages an output signal out(p) and an inverted output signal out(n) which are outputted from the switching amplifier circuit 3.

[Embodiment 9]

Figure 18:
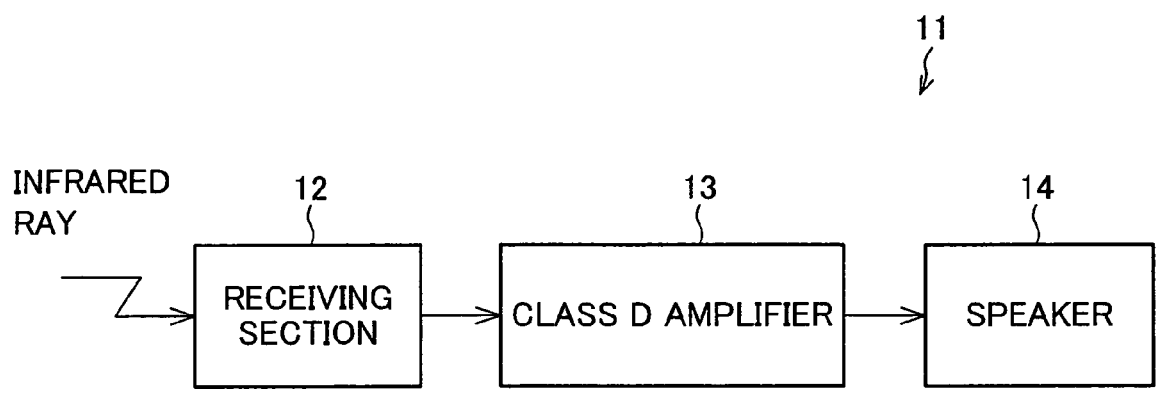
FIG. 18 is a block diagram illustrating a structure of an infrared data receiving apparatus which includes the class D amplifier.
Figure 19:
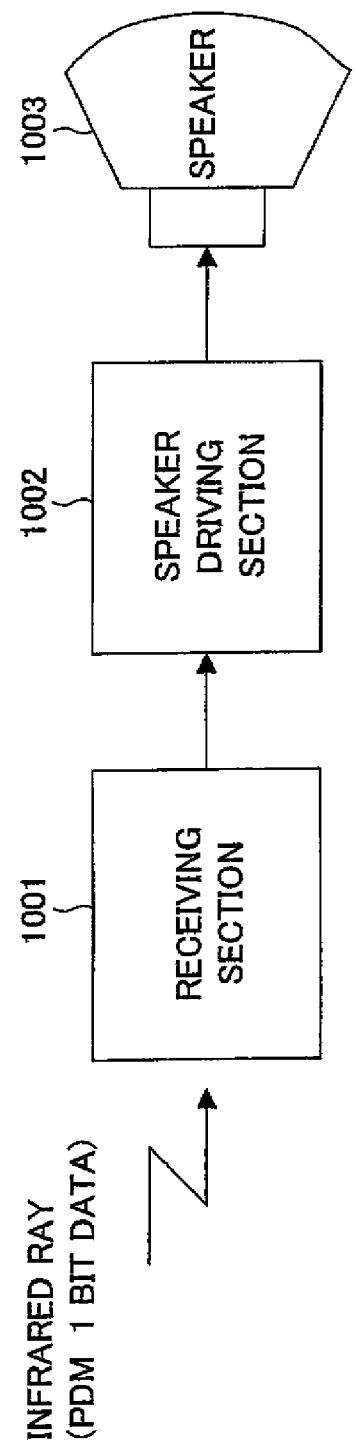
FIG. 19 is a block diagram illustrating a structure of a conventional infrared data receiving apparatus.
Figure 20:
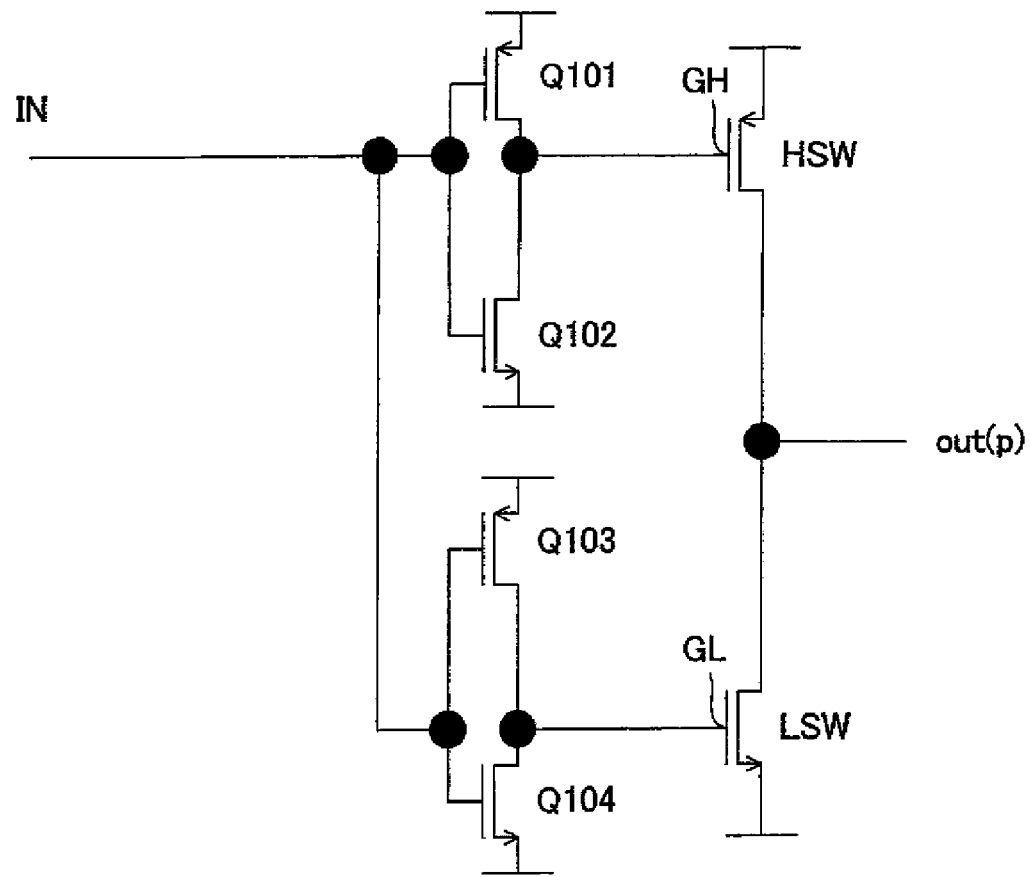
FIG. 20 is a circuit diagram illustrating a structure of a switching amplifier stage in a conventional class D amplifier.
Figure 21:
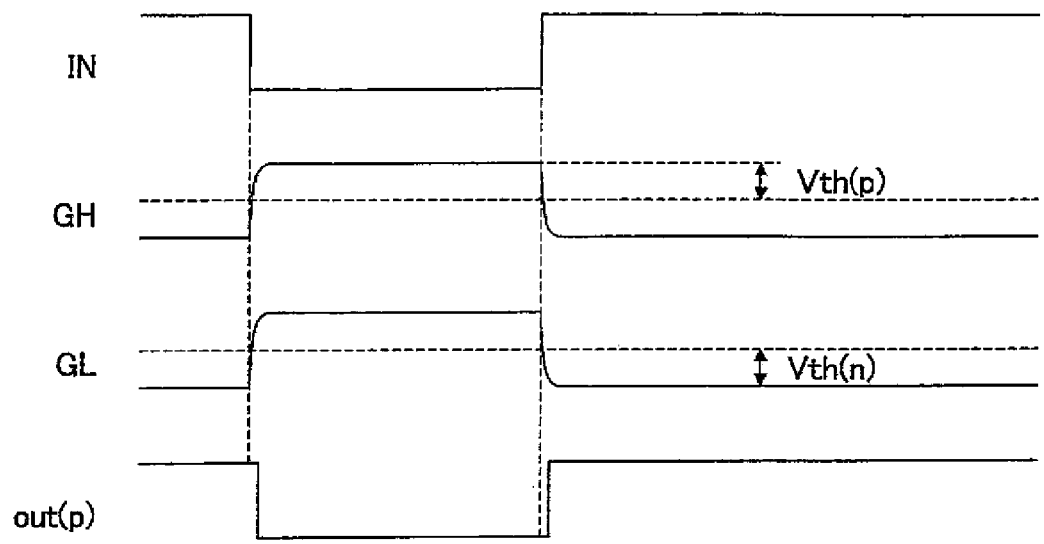
FIG. 21 is a timing chart illustrating an operation of the switching amplifier stage in FIG. 20.
Figure 22:
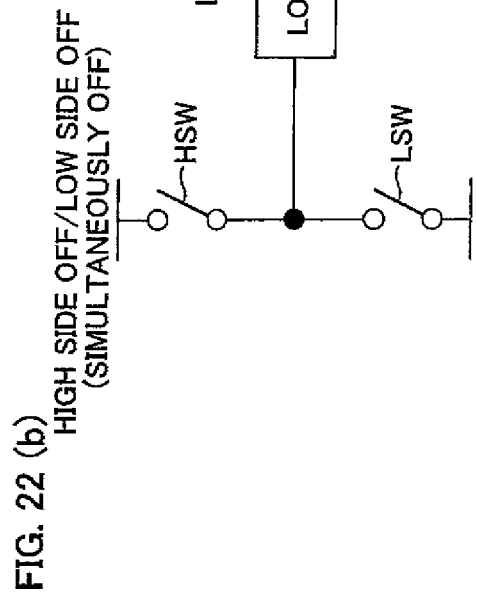
FIGS. 22(a) to 22(d) are drawings illustrating different conditions in the operation of the switching amplifier stage in FIG. 20.
Figure 22:
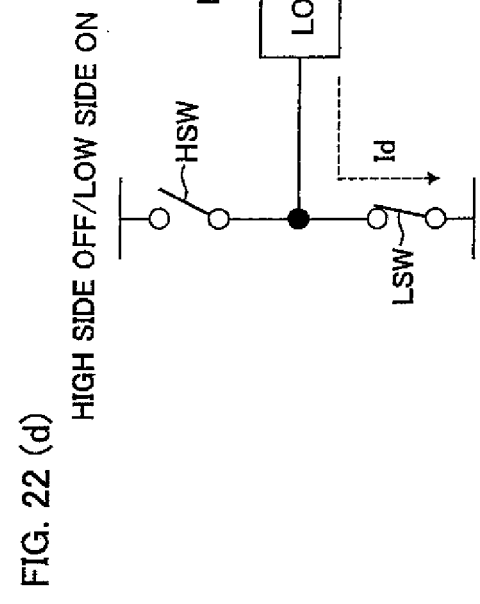
Figure 22:
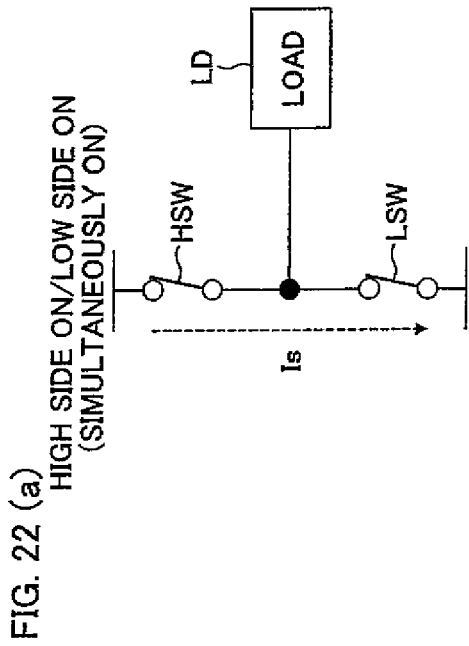
Figure 22:
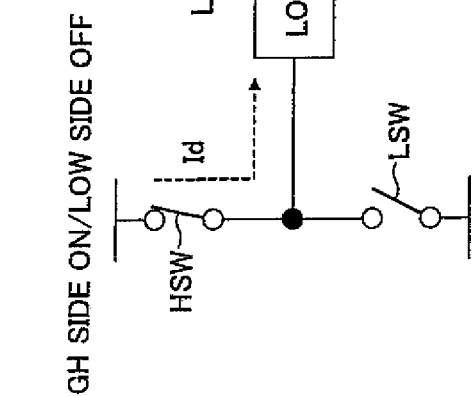
Figure 23:
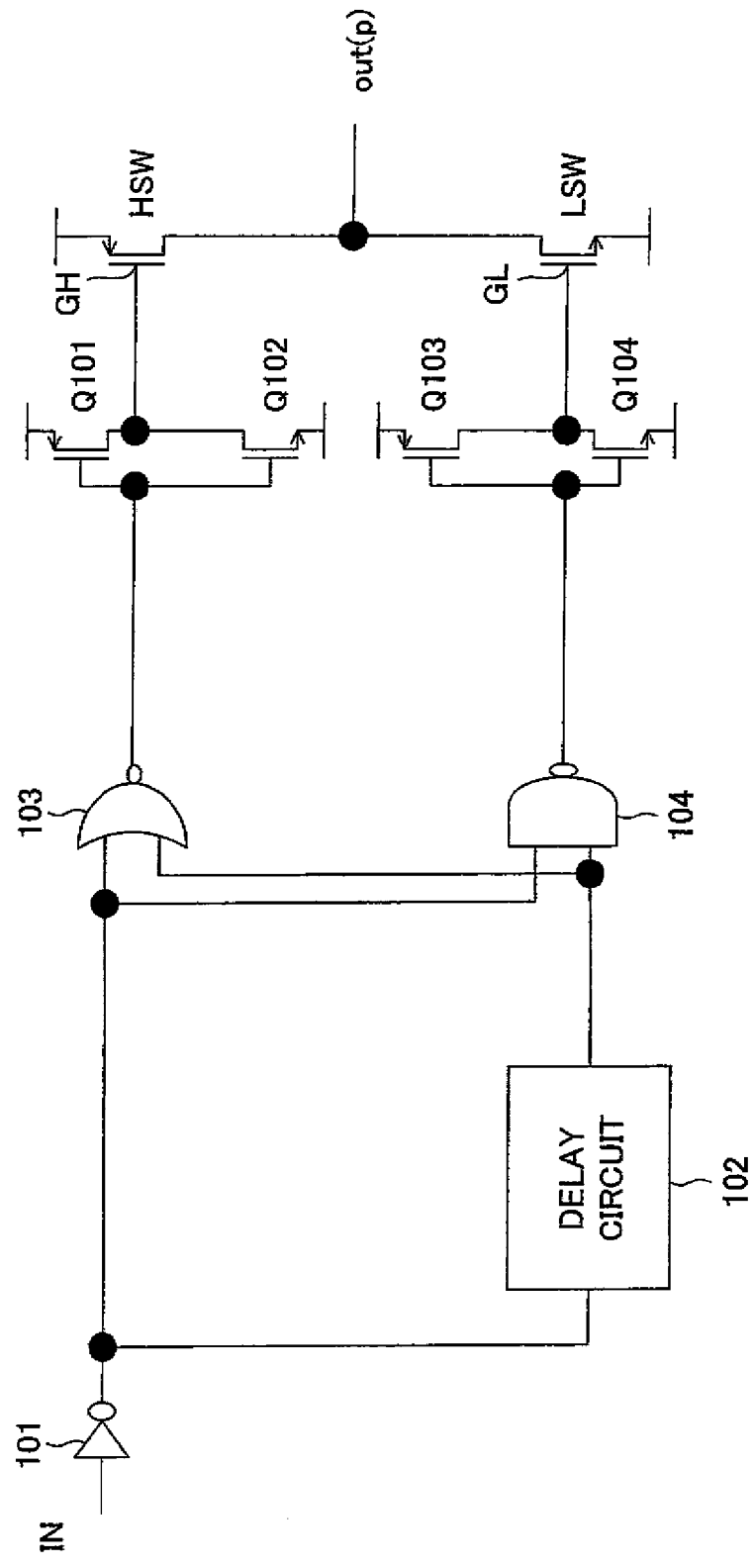
FIG. 23 is a circuit diagram illustrating structures of a dead time generating circuit and a switching amplifier stage in another conventional class D amplifier.
Figure 24:
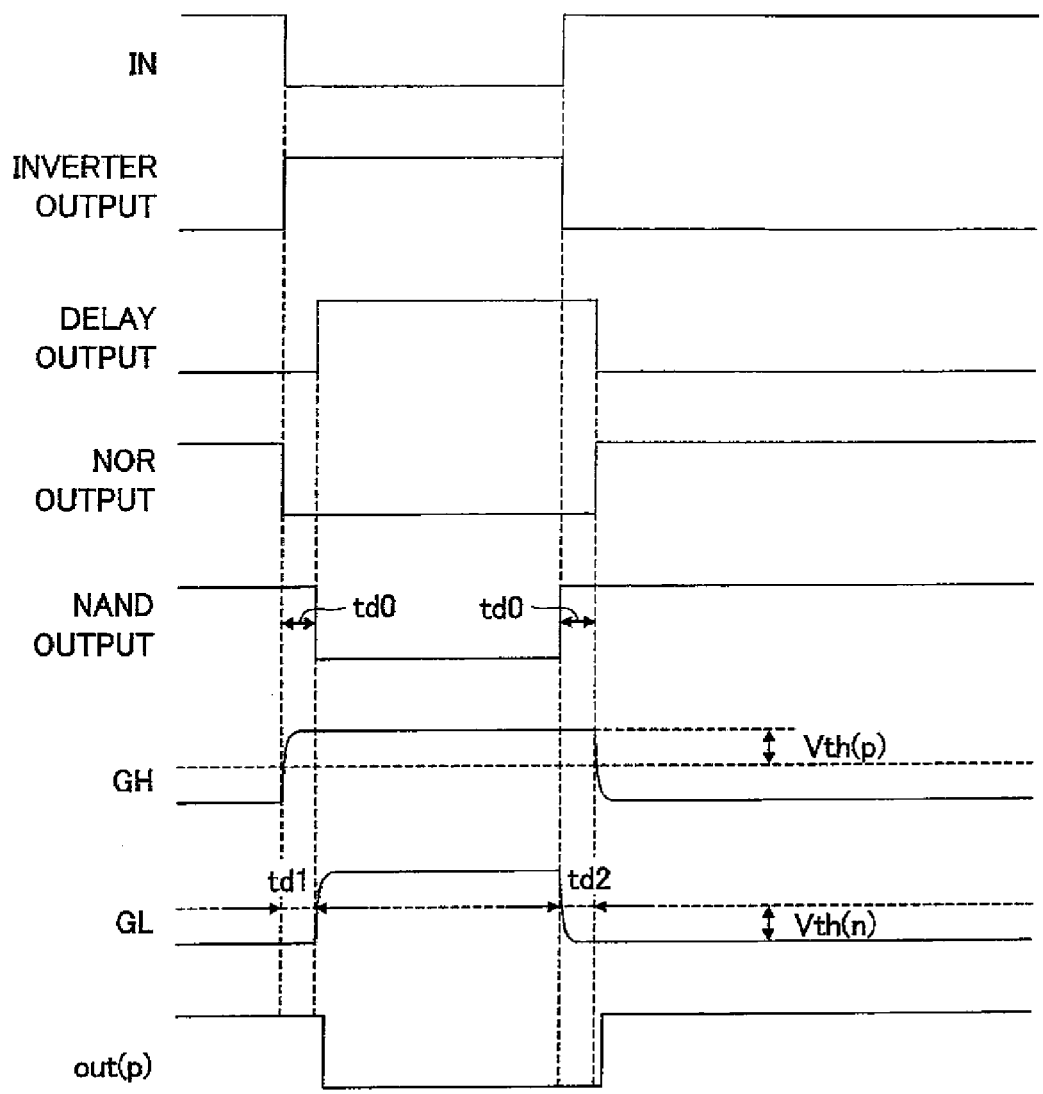
FIG. 24 is a timing chart illustrating operations of a dead time adjusting circuit and a switching amplifier stage.

FIG. 18 illustrates a structure of an infrared data receiving apparatus 11.

As illustrated in FIG. 18, the infrared data receiving apparatus 11 includes a receiving section 12, a class D amplifier 13, and a speaker 14.

The receiving section 12 receives a data sequence constituted of a light pulse having been subjected to a PDM or a PWM and converts the data sequence into a pulse signal. The receiving section 12 includes the IrDA receiving device or the infrared remote control receiving device, and wirelessly communicates with an infrared data transmitting device (not shown). The class D amplifier 1 is used as the class D amplifier 13.

In the infrared data receiving apparatus having the above structure, a light pulse is received by the receiving section 12 and is converted into a pulse signal (PDM signal or PWM signal). The pulse signal is amplified by the class D amplifier 13 and the speaker 14 is driven in response to the amplified pulse signal.

As described above, the dead time of the class D amplifier 13 can be set with a simple structure, so that it is easy to downsize the class D amplifier 13. Therefore, by providing the class D amplifier 13 in the infrared data receiving apparatus 11, the infrared data receiving apparatus 11 can be downsized.

Note that, in the present embodiment, an explanation is made as to an example in which the class D amplifier 13 is provided in an infrared data receiving apparatus. Alternatively, the class D amplifier 13 may be provided in an apparatus such as a portable audio reproducing apparatus which is driven by use of a battery. Consequently, a shoot-through current is reduced in the class D amplifier 13, so that power consumption caused by the shoot-through current is largely reduced and exhaustion of a battery is reduced. Further, the class D amplifier 13 is downsized, so that it is easy to downsize the audio reproducing apparatus.

SUMMARY OF EMBODIMENTS

As described above, the dead time adjusting circuit of the class D amplifier of the present embodiment is arranged so that: the high side gate driving circuit and the low side gate driving circuit are configured so that a charging time of the high side gate is set to be shorter than a discharging time of the high side gate, and a charging time of the low side gate is set to be longer than a discharging time of the low side gate. In this way, by setting the charging/discharging times of the high side gate and the low side gate, a dead time can be generated. Consequently, it is possible to set a desired dead time without using a complex circuit.

The class D amplifier of the present embodiment is arranged so that a dead time can be set with a simple structure. Therefore, the class D amplifier is applicable to a small apparatus for reproducing audio, driven by use of a battery.

It is preferable to arrange the class D amplifier so that the high side gate driving circuit includes an inverter circuit in which a first resistor is added to a drain of an nMOS transistor, and the low side gate driving circuit includes an inverter circuit in which a second resistor, having a resistance value identical with that of the first resistor, is added to a drain of a pMOS transistor.

Charging times and discharging times of the high side gate and the low side gate are determined by time constants between capacitances of the gates and ON resistances of the switching elements. Therefore, by adding the first and the second resistors, a charging time of the high side gate is set to be shorter than a discharging time of the high side gate and a charging time of the low side gate is set to be longer than a discharging time of the low side gate. Consequently, by adding the first and the second resistors and adjusting the resistance values thereof, it is possible to set a desired dead time.

Further, it is preferable to arrange the class D amplifier so that: the inverter circuit included in the high side gate driving circuit is configured so that a third resistor is added to a drain of a pMOS transistor, the inverter circuit included in the low side gate driving circuit is configured so that a fourth resistor, having a resistance value identical with that of the third resistor, is added to a drain of an nMOS transistor, and the resistance value of the first and second resistors is set so as to be greater than the resistance value of the third and fourth resistors.

With the arrangement, in the high side gate driving circuit, a difference in the resistance values between the first resistor and the third resistor causes a charging time of the high side gate to be shorter than a discharging time of the high side gate, and in the low side gate driving circuit, a difference in the resistance values between the second resistor and the fourth resistor causes a charging time of the low side gate to be longer than a discharging time of the low side gate. Therefore, by adding the first, second, third, and fourth resistors and adjusting the resistance values thereof, a desired dead time can be set.

Further, in the arrangement, it is preferable to arrange the class D amplifier so as to include capacitor elements one of which is provided between a gate and a drain of the high side switching element and the other of which is provided between a gate and a drain of the low side switching element. In a general integrated circuit process, variations in capacitance are smaller than variations in a resistance value. Therefore, by adding capacitance to parameters for setting a dead time, it is possible to reduce the influence of variations in characteristics of the element, compared with the arrangement in which only a resistance value is used as a parameter for setting a dead time.

It is preferable to arrange the class D amplifier so that: the high side gate driving circuit includes an inverter circuit in which a ratio of a gate width to a gate length of an nMOS transistor is set so as to be smaller than a ratio of a gate width to a gate length of a pMOS transistor, and the low side gate driving circuit includes an inverter circuit in which a ratio of a gate width to a gate length of a pMOS transistor is set so as to be smaller than a ratio of a gate width to a gate length of an nMOS transistor.

An ON resistance of an MOS transistor is inversely proportional to a ratio (W/L) of a gate width (W) to a gate length (L) of the MOS transistor. Therefore, when W/L is large, the ON resistance is small, and when W/L is small, the ON resistance is large.

The arrangement uses the relation between W/L and the ON resistance. To be specific, in the high side gate driving circuit, by setting W/L of the nMOS transistor to be smaller than W/L of the pMOS transistor, ON resistance of the nMOS transistor becomes larger than ON resistance of the pMOS transistor. Further, in the low side gate driving circuit, by setting W/L of the pMOS transistor to be smaller than W/L of the nMOS transistor, ON resistance of the nMOS transistor becomes smaller than ON resistance of the pMOS transistor. Consequently, the charging time of the high side gate is set to be shorter than the discharging time of the high side gate and the charging time of the low side gate is set to be longer than the discharging time of the low side gate. Further, in the arrangement, the first, second, third, and fourth resistances are unnecessary, so that it is possible to further simplify the structure of the class D amplifier.

In each of the arrangements of the class D amplifier, it is preferable to arrange the class D amplifier so that the class D amplifier includes a delay time providing circuit for providing a predetermined delay time (i) during a period from a rising edge of a potential of the high side gate to a rising edge of a potential of the low side gate and (ii) during a period from a falling edge of the potential of the low side gate to a falling edge of the potential of the high side gate. Such delay time providing means allows for setting a dead time in a manner different from the manners in the arrangements for setting the dead time. Consequently, in a case where a resistance value is increased so as to lengthen a dead time and the resistance value results in not satisfying operational specs of the switching elements, by setting a dead time mainly based on a delay time provided by the delay time providing means, it is possible to avoid the above inconvenience.

The class D amplifier of the present embodiment is arranged so as to include: two amplifier circuits each including a high side switching element and a low side switching element connected in series between power sources; two driving circuits each including (i) a high side gate driving circuit for driving a high side gate of the high side switching element and (ii) a low side gate driving circuit for driving a low side gate of the low side switching element, the high side gate driving circuit and the low side gate driving circuit being configured so that a charging time of the high side gate is set to be shorter than a discharging time of the high side gate, and a charging time of the low side gate is set to be longer than a discharging time of the low side gate; and an inverter circuit for inverting an input signal to be inputted to one of the two driving circuits. Therefore, it is possible to use a full-bridge type low pass filter for receiving the two amplified outputs as a low pass filter provided in a subsequent stage of the two amplifier circuits.

The apparatus for receiving infrared data of the present embodiment includes a receiving section for receiving audio data which is transmitted in a form of an infrared pulse signal, and an amplifier for amplifying an output from the receiving section, the amplifier being any one of the class D amplifiers.

With the arrangement, in the class D amplifier provided in the apparatus for receiving infrared data, a dead time can be set with a simple structure as described above, which allows for downsizing the class D amplifier. Consequently, it is easy to downsize the apparatus for receiving infrared data.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A class D amplifier, comprising:
an amplifier circuit in which a high side switching element and a low side switching element are connected in series between power sources;

a high side gate driving circuit including a first inverter circuit, for driving a high side gate of the high side switching element; and a low side gate driving circuit including a second inverter circuit, for driving a low side gate of the low side switching element, wherein the high side gate driving circuit and the low side gate driving circuit are configured so that a charging time of the high side gate is set to be shorter than a discharging time of the high side gate, and a charging time of the low side gate is set to be longer than a discharging time of the low side gate.

2. The class D amplifier as set forth in claim 1, wherein the first inverter circuit includes a first nMOS transistor and a first resistor that is added to a drain of the first nMOS transistor, and the second inverter circuit includes a first pMOS transistor and a second resistor that has a resistance value identical with that of the first resistor and that is added to a drain of the first pMOS transistor.

3. The class D amplifier circuit as set forth in claim 2, wherein the first inverter circuit is configured so that a third resistor is added to a drain of a second pMOS transistor, the second inverter circuit is configured so that a fourth resistor, having a resistance value identical with that of the third resistor, is added to a drain of a second nMOS transistor, and the resistance value of the first and second resistors is set so as to be greater than the resistance value of the third and fourth resistors.

4. The class D amplifier as set forth in claim 2, further comprising capacitor elements one of which is provided between a gate and a drain of the high side switching element and the other of which is provided between a gate and a drain of the low side switching element.

5. A class D amplifier, comprising:

an amplifier circuit in which a high side switching element and a low side switching element are connected in series between power sources;

a high side gate driving circuit for driving a high side gate of the high side switching element; and a low side gate driving circuit for driving a low side gate of the low side switching element, wherein the high side gate driving circuit and the low side gate driving circuit are configured so that a charging time of the high side gate is set to be shorter than a discharging time of the high side gate, and a charging time of the low side gate is set to be longer than a discharging time of the low side gate, the high side gate driving circuit includes an inverter circuit in which a ratio of a gate width to a gate length of an nMOS transistor is set so as to be smaller than a ratio of a gate width to a gate length of a pMOS transistor, and the low side gate driving circuit includes an inverter circuit in which a ratio of a gate width to a gate length of a pMOS transistor is set so as to be smaller than a ratio of a gate width to a gate length of an nMOS transistor.

6. A class D amplifier, comprising:

an amplifier circuit in which a high side switching element and a low side switching element are connected in series between power sources;

a high side gate driving circuit for driving a high side gate of the high side switching element;

a low side gate driving circuit for driving a low side gate of the low side switching element; and a delay time providing circuit for providing a predetermined delay time (i) during a period from a rising edge of a potential of the high side gate to a rising edge of a potential of the low side gate and (ii) during a period from a falling edge of the potential of the low side gate to a falling edge of the potential of the high side gate, where the high side gate driving circuit and the low side gate driving circuit are configured so that a charging time of the high side gate is set to be shorter than a discharging time of the high side gate, and a charging time of the low side gate is set to be longer than a discharging time of the low side gate.

7. A class D amplifier, comprising:

two amplifier circuits each including a high side switching element and a low side switching element connected in series between power sources;

two driving circuits each including (i) a high side gate driving circuit for driving a high side gate of the high side switching element and (ii) a low side gate driving circuit for driving a low side gate of the low side switching element, the high side gate driving circuit and the low side gate driving circuit being configured so that a charging time of the high side gate is set to be shorter than a discharging time of the high side gate, and a charging time of the low side gate is set to be longer than a discharging time of the low side gate; and an inverter circuit for inverting an input signal to be inputted to one of the two driving circuits.

8. An apparatus for receiving infrared data, comprising a receiving section for receiving audio data which is transmitted in a form of an infrared pulse signal, and an amplifier for amplifying an output from the receiving section, wherein the amplifier is a class D amplifier which includes: an amplifier circuits in which a high side switching element and a low side switching element are connected in series with power sources; a high side gate driving circuit including a first inverter for driving a high side gate of the high side switching element; and a low side gate driving circuit including a second inverter for driving a low side gate of the low side switching element, the high side gate driving circuit and the low side gate driving circuit being configured so that a charging time of the high side gate is set to be shorter than a discharging time of the high side gate, and a charging time of the low side gate is set to be longer than a discharging time of the low side gate.

9. The apparatus as set forth in claim 8, wherein the first inverter circuit includes a first nMOS transistor and a first resistor that is added to a drain of a first nMOS transistor, and the second inverter circuit includes a first pMOS transistor and a second resistor that has a resistance value identical with that of the first resistor and is added to a drain of the first pMOS transistor.

10. The apparatus as set forth in claim 9, wherein the first inverter circuit is configured so that a third resistor is added to a drain of a second pMOS transistor, the second inverter circuit is configured so that a fourth resistor, having a resistance value identical with that of the third resistor, is added to a drain of a second nMOS transistor, and the resistance value of the first and second resistors is set so as to be greater than the resistance value of the third and fourth resistors.

11. The apparatus as set forth in claim 9, wherein the amplifier further includes capacitor elements one of which is provided between a gate and a drain of the high side switching element and the other of which is provided between a gate and a drain of the low side switching element.

12. An apparatus for receiving infrared data, comprising:
a receiving section for receiving audio data which is transmitted in a form of an infrared pulse signal, and
an amplifier for amplifying an output from the receiving section,
wherein
the amplifier is a class D amplifier which includes: an amplifier circuits in which a high side switching element and a low side switching element are connected in series with power sources; a high side gate driving circuit for driving a high side sate of the high side switching element; and a low side gate diving circuit for driving a low side gate of the low side switching element the high side gate driving circuit and the low side gate driving circuit being configured so that a charging time of the high side gate is set to be shorter than a discharging time of the high side gate, and a charging time of the low side gate is set to be longer than a discharging time of the low side gate,
the high side gate driving circuit includes an inverter circuit in which a ratio of a gate width to a gate length of an nMOS transistor is set so as to be smaller than a ratio of a gate width to a gate length of a pMOS transistor, and
the low side gate driving circuit includes an inverter circuit in which a ratio of a gate width to a gate length of a pMOS transistor is set so as to be smaller than a ratio of a gate width to a gate length of an nMOS transistor.

13. An apparatus for receiving infrared data, comprising:
a receiving section for receiving audio data which is transmitted in a form of an infrared pulse signal, and
an amplifier for amplifying an output from the receiving section, wherein the amplifier further includes a delay time providing circuit for providing a predetermined delay time (i) during a period from a rising edge of a potential of the high side gate to a rising edge of a potential of the low side gate and (ii) during a period from a falling edge of the potential of the low side gate to a falling edge of the potential of the high side gate, and
wherein the amplifier is a class D amplifier which includes: an amplifier circuits in which a high side switching element and a low side switching element are connected in series with power sources; a high side gate driving circuit for driving a high side gate of the high side switching element; and a low side gate driving circuit for driving a low side gate of the low side switching element, the high side gate driving circuit and the low side gate driving circuit being configured so that a charging time of the high side gate is set to be shorter than a discharging time of the high side gate, and a charging time of the low side gate is set to be longer than a discharging time of the low side gate.

14. An apparatus for receiving infrared data, comprising
a receiving section for receiving audio data which is transmitted in a form of an infrared pulse signal, and
an amplifier for amplifying an output from the receiving section,
wherein
the amplifier includes:
two amplifier circuits each including a high side switching element and a low side switching element connected in series between power sources;
two driving circuits each including (i) a high side gate driving circuit for driving a high side gate of the high side switching element and (ii) a low side gate driving circuit for driving a low side gate of the low side switching element, the high side gate driving circuit and the low side gate driving circuit being configured so that a charging time of the high side gate is set to be shorter than a discharging time of the high side gate, and a charging time of the low side gate is set to be longer than a discharging time of the low side gate; and
an inverter circuit for inverting an input signal to be inputted to one of the two driving circuits.

* * * * *